US009991219B2

(12) United States Patent
Seol et al.

(10) Patent No.: US 9,991,219 B2
(45) Date of Patent: Jun. 5, 2018

(54) FAN-OUT SEMICONDUCTOR PACKAGE MODULE

(71) Applicant: SAMSUNG ELECTRO-MECHANICS CO., LTD., Suwon-si, Gyeonggi-do (KR)

(72) Inventors: Yong Jin Seol, Suwon-si (JP); Yong Koon Lee, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days. days.

(21) Appl. No.: 15/478,374

(22) Filed: Apr. 4, 2017

(65) Prior Publication Data

US 2017/0373035 A1   Dec. 28, 2017

(30) Foreign Application Priority Data

Jun. 23, 2016  (KR) .................. 10-2016-0078580
Jul. 29, 2016  (KR) .................. 10-2016-0097123

(51) Int. Cl.
| | |
|---|---|
| *H01L 23/48* | (2006.01) |
| *H01L 23/00* | (2006.01) |
| *H01L 25/18* | (2006.01) |

(52) U.S. Cl.
CPC .............. *H01L 24/25* (2013.01); *H01L 24/06* (2013.01); *H01L 24/13* (2013.01); *H01L 24/14* (2013.01); *H01L 24/16* (2013.01); *H01L 24/24* (2013.01); *H01L 25/18* (2013.01); *H01L 2224/02373* (2013.01); *H01L 2224/02379* (2013.01); *H01L 2224/02381* (2013.01);
(Continued)

(58) Field of Classification Search
CPC ......... H01L 24/06; H01L 24/18; H01L 24/25; H01L 224/02373; H01L 224/02379; H01L 25/043
USPC ........................................................ 257/777
See application file for complete search history.

(56) References Cited

U.S. PATENT DOCUMENTS 8,304,880 B2 * 11/2012 Chow .................. H01L 21/563
257/685
8,378,477 B2 * 2/2013 Do ....................... H01L 21/566
257/685
(Continued)

*Primary Examiner* — Nitin Parekh
(74) *Attorney, Agent, or Firm* — McDermott Will & Emery LLP

(57) ABSTRACT

A fan-out semiconductor package module includes: a fan-out semiconductor package including a first interconnection member having a through-hole, a semiconductor chip disposed in the through-hole, an encapsulant encapsulating at least portions of the first interconnection member and the semiconductor chip, a second interconnection member disposed on the first interconnection member and the semiconductor chip, a third interconnection member disposed on the encapsulant, first connection terminals disposed on the second interconnection member, and second connection terminals disposed on the third interconnection member, the first to third interconnection members including, respectively, redistribution layers electrically connected to connection pads of the semiconductor chip; and a component package stacked on the fan-out semiconductor package and including a wiring substrate connected to the second interconnection member through the first connection terminals and a plurality of mounted components mounted on the wiring substrate.

19 Claims, 16 Drawing Sheets

(52) U.S. Cl.
CPC .............. *H01L 2224/0401* (2013.01); *H01L 2224/04105* (2013.01); *H01L 2224/06131* (2013.01); *H01L 2224/06135* (2013.01); *H01L 2224/06139* (2013.01); *H01L 2224/06177* (2013.01); *H01L 2224/06182* (2013.01); *H01L 2224/13024* (2013.01); *H01L 2224/14131* (2013.01); *H01L 2224/14135* (2013.01); *H01L 2224/14181* (2013.01); *H01L 2224/16227* (2013.01); *H01L 2224/24105* (2013.01); *H01L 2224/24226* (2013.01); *H01L 2224/2518* (2013.01); *H01L 2224/25171* (2013.01); *H01L 2924/19102* (2013.01)

(56) References Cited

U.S. PATENT DOCUMENTS

| | | | |
|---|---|---|---|
| 8,716,065 B2* | 5/2014 | Chi | H01L 23/3135 257/686 |
| 8,779,606 B2* | 7/2014 | Yim | H01L 23/10 257/686 |
| 8,890,628 B2 | 11/2014 | Nair et al. | |
| 9,356,006 B2* | 5/2016 | Haba | H01L 25/105 |
| 9,728,498 B2* | 8/2017 | Su | H01L 23/49838 |
| 2004/0014317 A1* | 1/2004 | Sakamoto | H01L 21/568 438/689 |
| 2008/0136004 A1* | 6/2008 | Yang | H01L 24/96 257/686 |
| 2009/0309202 A1* | 12/2009 | Hsu | H01L 23/3128 257/680 |
| 2012/0074586 A1* | 3/2012 | Seo | H01L 25/16 257/774 |
| 2013/0207247 A1 | 8/2013 | Pagaila et al. | |
| 2015/0102503 A1* | 4/2015 | Lin | H01L 23/481 257/774 |

\* cited by examiner

I-I'

II-II' a b

FAN-OUT SEMICONDUCTOR PACKAGE MODULE

CROSS-REFERENCE TO RELATED APPLICATION(S)

This application claims the benefit of priority to Korean Patent Application Nos. 10-2016-0078580 filed on Jun. 23, 2016 and 10-2016-0097123 filed on Jul. 29, 2016 in the Korean Intellectual Property Office, the entire disclosure of which is incorporated herein by reference.

BACKGROUND

1. Technical Field

The present disclosure relates to a semiconductor package module, and more particularly, to a fan-out semiconductor package module in which connection terminals may extend outwardly of a region in which a semiconductor chip is disposed.

2. Description of Related Art

Components such as memories, baseband integrated circuits (ICs), radio frequency (RF) ICs (RFICs), power management integrated circuits (PMICs), RF matching components, power terminal bypass components, and the like, are commonly mounted in mobile devices. However, in a case in which these components are implemented in a single module, a thickness and a size of the module may be significantly large.

In some modules, in order to solve this problem, components have been mounted on upper and lower surfaces of wiring substrates, sub-wiring substrates have been introduced, and pads for mounting electronic devices on main boards have been formed on sub-wiring substrates. However, there is a limitation in the forms of ICs mounted on the lower surface of the wiring substrate, and there is a problem in terms of reliability.

SUMMARY

An aspect of the present disclosure may provide a micro fan-out semiconductor package module that has increased functionality and improved reliability.

According to an aspect of the present disclosure, a micro fan-out semiconductor package module may be provided, in which a wiring substrate in which components are mounted is stacked on a fan-out semiconductor package in which a semiconductor chip is disposed in a face-up form.

According to an aspect of the present disclosure, a fan-out semiconductor package module may include: a fan-out semiconductor package including a first interconnection member having a through-hole, a semiconductor chip disposed in the through-hole of the first interconnection member and having an active surface having connection pads disposed thereon and an inactive surface opposing the active surface, an encapsulant encapsulating at least portions of the first interconnection member and the inactive surface of the semiconductor chip, a second interconnection member disposed on the first interconnection member and the active surface of the semiconductor chip, first connection terminals disposed on the second interconnection member, and second connection terminals disposed on the encapsulant, the first interconnection member and the second interconnection member including, respectively, redistribution layers electrically connected to the connection pads of the semiconductor chip; and a component package including a wiring substrate disposed above the second interconnection member and connected to the second interconnection member through the first connection terminals and at least one component disposed on the wiring substrate and electrically connected to the wiring substrate.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
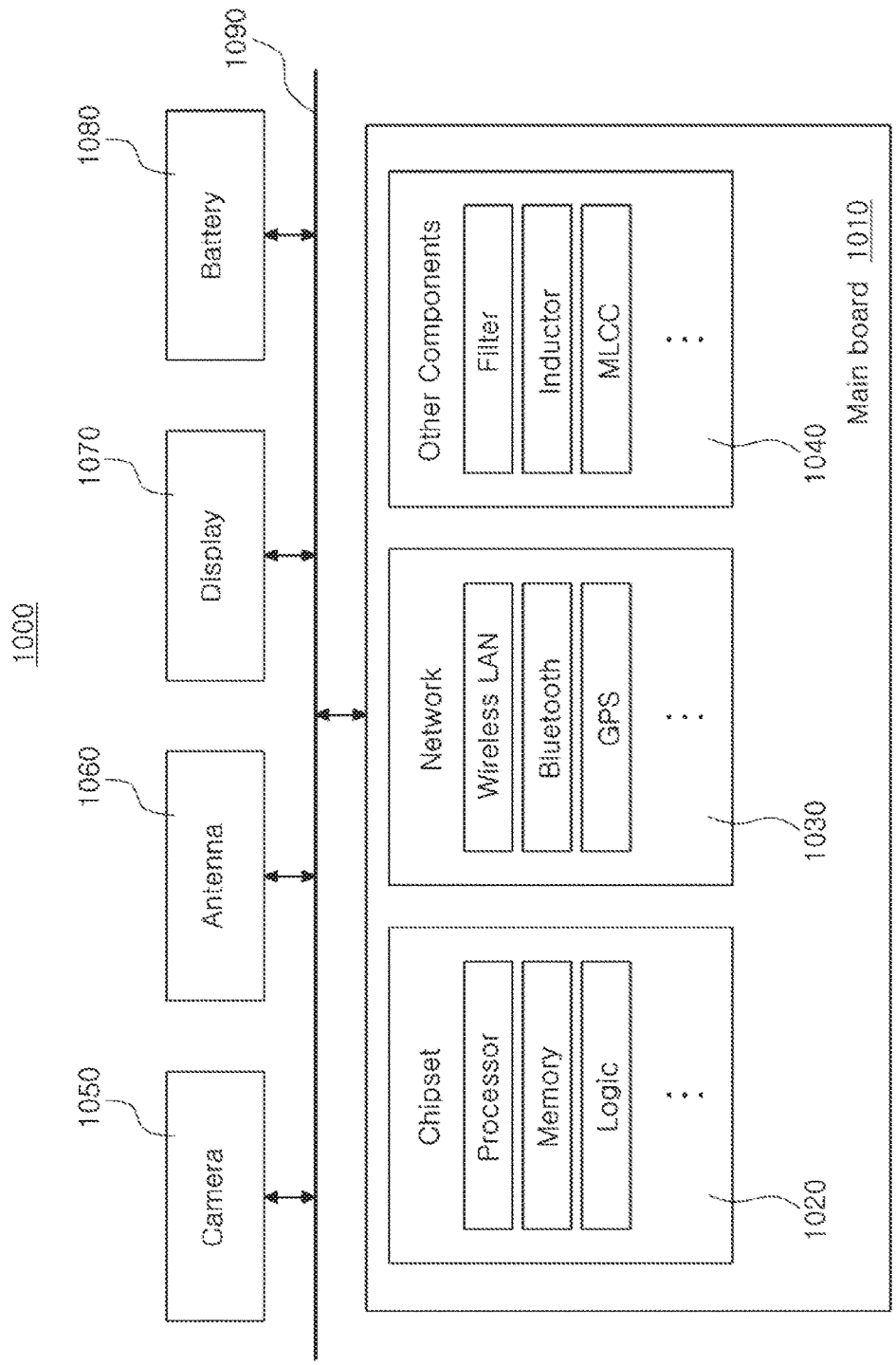
FIG. 1 is a schematic block diagram illustrating an example of an electronic device system.

Hereinafter, exemplary embodiments in the present disclosure will be described with reference to the accompanying drawings. In the accompanying drawings, shapes, sizes, and the like, of components may be exaggerated or omitted for clarity.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

The meaning of a "connection" of a component to another component in the description includes an indirect connection through a third component as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

Herein, an upper portion, a lower portion, an upper side, a lower side, an upper surface, a lower surface, and the like, are as depicted in the attached drawings. For example, a first interconnection member is disposed on a level above a redistribution layer. However, the claims are not limited thereto. In addition, a vertical direction refers to the abovementioned upward and downward directions, and a horizontal direction refers to a direction perpendicular to the abovementioned upward and downward directions. In this case, a vertical cross section refers to a case taken along a plane in the vertical direction, and an example thereof may be a cross-sectional view illustrated in the drawings. In addition, a horizontal cross section refers to a case taken along a plane in the horizontal direction, and an example thereof may be a plan view illustrated in the drawings.

Terms used herein are used only in order to describe an exemplary embodiment rather than limiting the present disclosure. In this case, singular forms include plural forms unless interpreted otherwise in context.

Electronic Device

FIG. 1 is a schematic block diagram illustrating an example of an electronic device system.

Referring to FIG. 1, an electronic device 1000 may accommodate a main board 1010 therein. The main board 1010 may include chip-related components 1020, network-related components 1030, other components 1040, and the like, physically or electrically connected to others thereto. These components may be connected to others to be described below to form various signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip-related components 1020 are not limited thereto, and may also include other types of chip-related components. In addition, the chip-related components 1020 may be combined with each other.

The network-related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network-related components 1030 are not limited thereto, and may also include a variety of other wireless or wired standards or protocols. In addition, the network-related components 1030 may be combined with each other, together with the chip-related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip-related components 1020 or the network-related components 1030 described above.

Depending on a type of the electronic device 1000, the electronic device 1000 may include other components that may or may not be physically or electrically connected to the main board 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
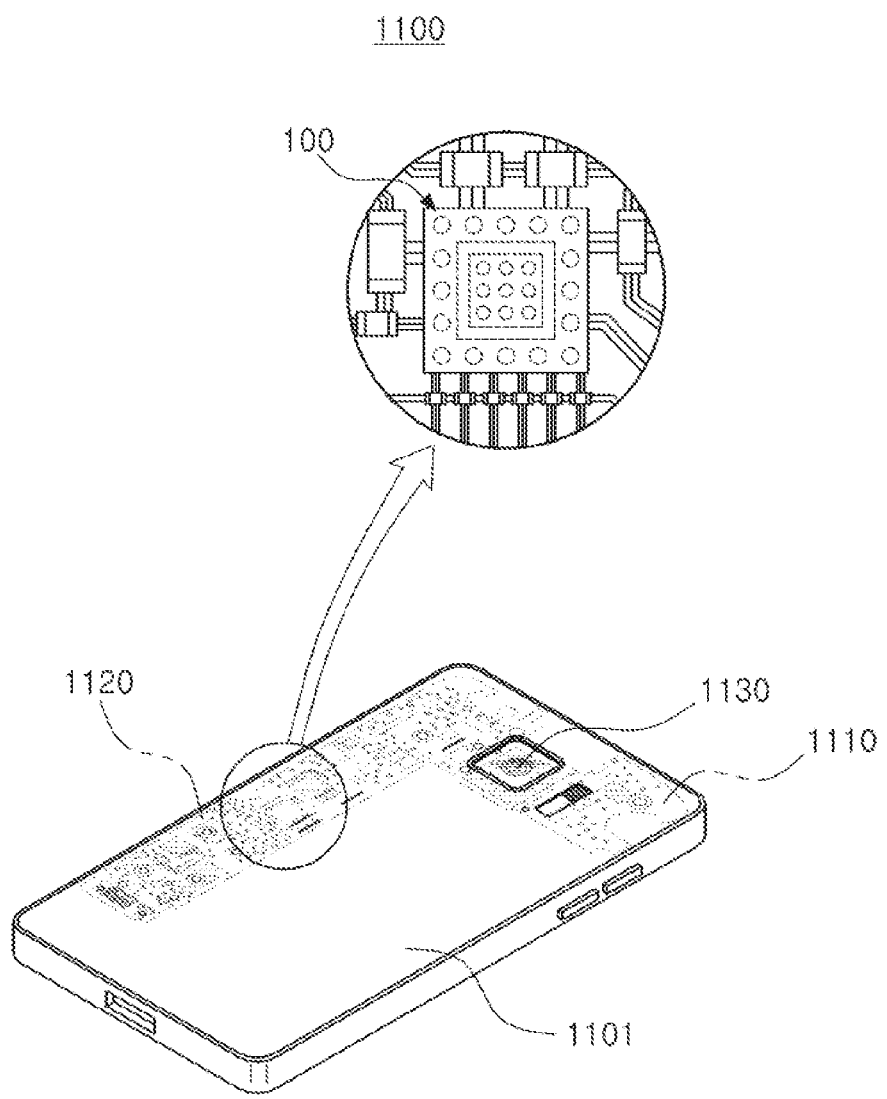
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a main board 1110 may be accommodated in a body 1101 of a smartphone 1100, and various electronic components 1120 may be physically or electrically connected to the main board 1110. In addition, other components that may or may not be physically or electrically connected to the main board 1110, such as a camera module 1130, may be accommodated in the body 1101. Some of the electronic components 1120 may be the chip-related components, and the semiconductor package 100 may be, for example, an application processor among the chip-related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in circuit widths between the semiconductor chip and a main board of the electronic device in terms of electrical connections. In detail, a size of connection pads of the semiconductor chip and intervals between the connection pads of the semiconductor chip are very fine, while sizes of component mounting pads of the main board used in the electronic device and an interval between the component mounting pads of the main board are significantly larger than those of the semiconductor chip. Therefore, it may be difficult to directly mount the semiconductor chip on the main board, and packaging technology for buffering a difference in circuit widths between the semiconductor chip and the main board is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3B:
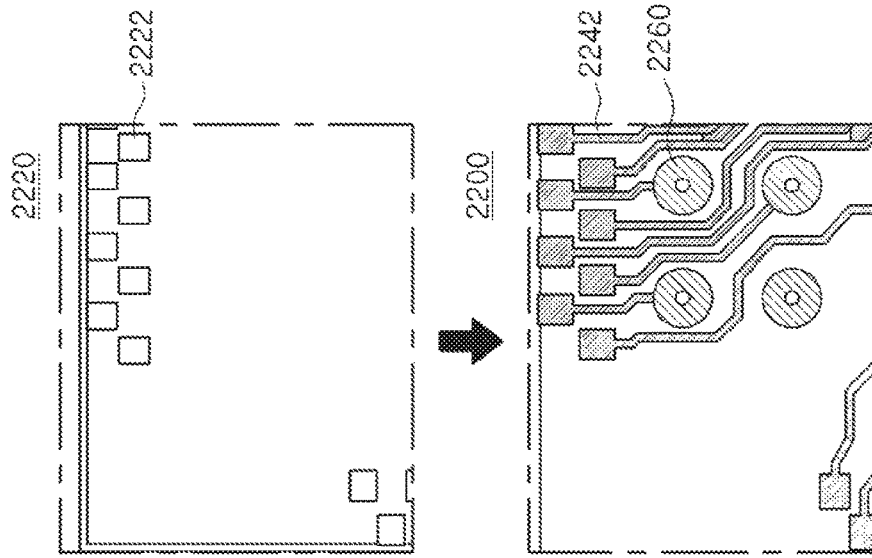
FIGS. 3A and 3B are schematic cross-sectional views illustrating states of a fan-in semiconductor package before and after being packaged.
Figure 3A:
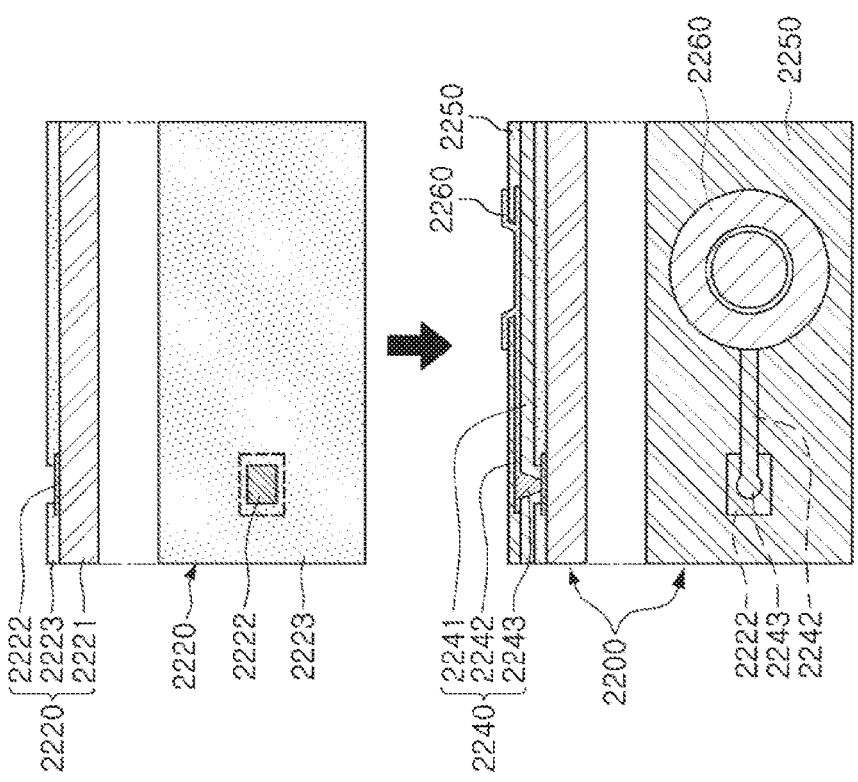

FIGS. 3A and 3B are schematic cross-sectional views illustrating states of a fan-in semiconductor package before and after being packaged.

Figure 4:
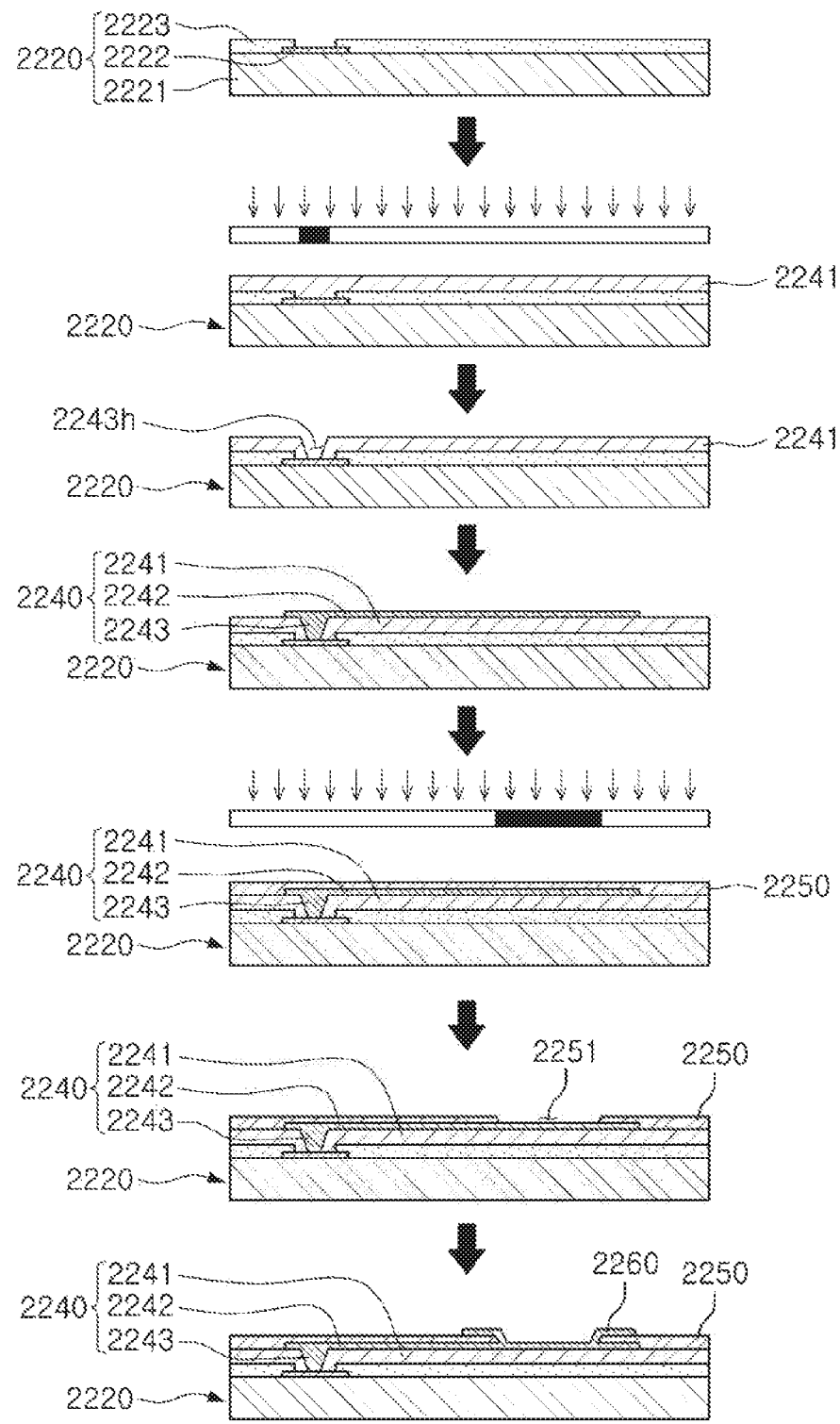
FIG. 4 is schematic cross-sectional views illustrating a packaging process of a fan-in semiconductor package.

FIG. 4 is schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it is difficult to mount the integrated circuit (IC) on an intermediate level printed circuit board (PCB) as well as on the main board of the electronic device, or the like.

Therefore, a interconnection member 2240 may be formed on the semiconductor chip 2220 depending on a size thereof in order to redistribute the connection pads 2222. The interconnection member 2240 may be formed by forming an insulating layer 2241 on the semiconductor chip 2220 using an insulating material such as photoimagable dielectric (PID) resin, forming via holes 2243h opening the connection pads 2222, and then forming wiring patterns 2242 and vias 2243. Then, a passivation layer 2250 protecting the interconnection member 2240 may be formed, an opening 2251 may be formed, and an under-bump metal layer 2260, or the like, may be formed. That is, a fan-in semiconductor package 2200 including, for example, the semiconductor chip 2220, the interconnection member 2240, the passivation layer 2250, and the under-bump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the main board of the electronic device. Here, even in the case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
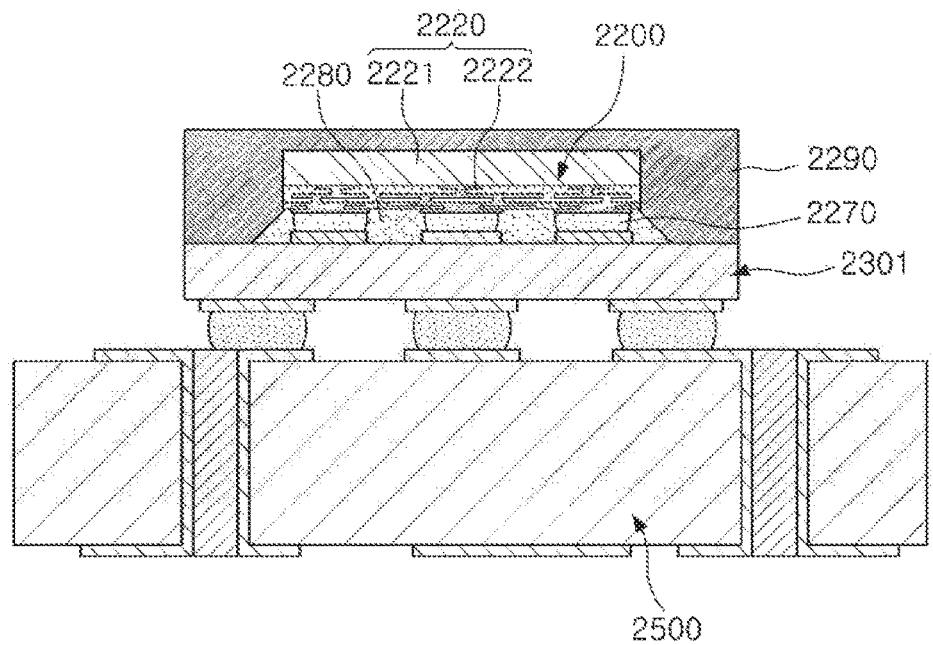
FIG. 5 is a schematic cross-sectional view illustrating a case in which a fan-in semiconductor package is mounted on an interposer substrate and is ultimately mounted on a main board of an electronic device.

FIG. 5 is a schematic cross-sectional view illustrating a case in which a fan-in semiconductor package is mounted on an interposer substrate and is ultimately mounted on a main board of an electronic device.

Figure 6:
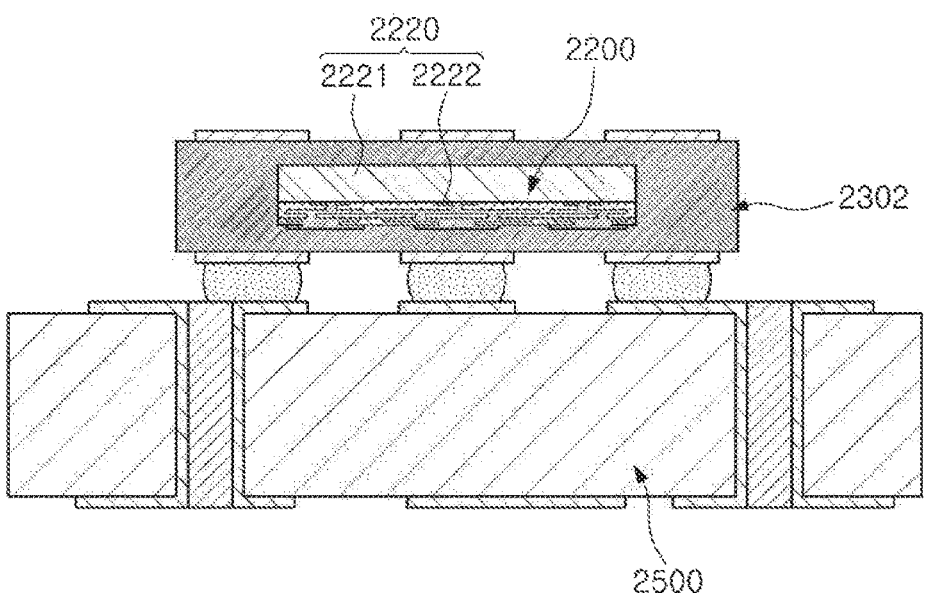
FIG. 6 is a schematic cross-sectional view illustrating a case in which a fan-in semiconductor package is embedded in an interposer substrate and is ultimately mounted on a main board of an electronic device.

FIG. 6 is a schematic cross-sectional view illustrating a case in which a fan-in semiconductor package is embedded in an interposer substrate and is ultimately mounted on a main board of an electronic device.

Referring to the drawings, in a fan-in semiconductor package 2200, connection pads 2222, that is, I/O terminals, of a semiconductor chip 2220 may be redistributed once more through an interposer substrate 2301, and the fan-in semiconductor package 2200 may be ultimately mounted on a main board 2500 of an electronic device in state of being mounted on the interposer substrate 2301. In this case, solder balls 2270, and the like, may be fixed by an underfill resin 2280, or the like, and an external surface of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed once more by the interposer substrate 2302 in a state in which the fan-in semiconductor package 2200 is embedded in the interposer substrate 2302, and the fan-in semiconductor package 2200 may be ultimately mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and be then mounted on the main board of the electronic device through a packaging process or may be mounted and used on the main board of the electronic device in a state in which it is embedded in the interposer substrate.

Fan-Out Semiconductor Package

Figure 7:
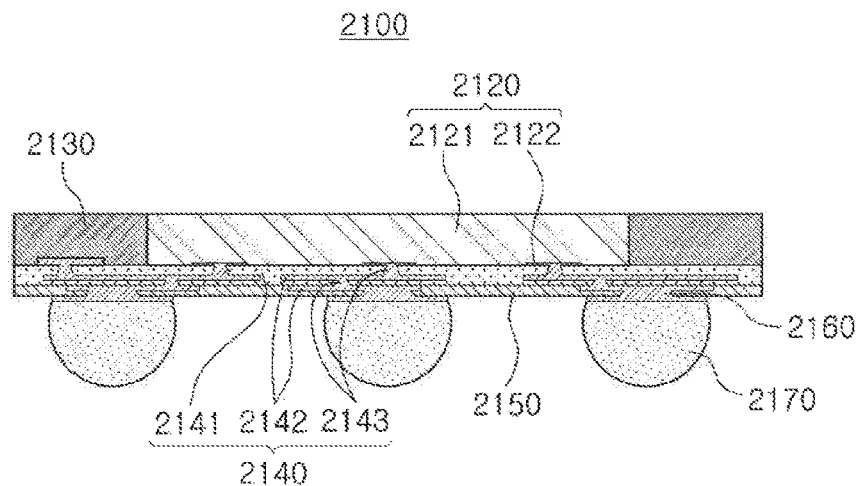
FIG. 7 is a schematic cross-sectional view illustrating a fan-out semiconductor package.

FIG. 7 is a schematic cross-sectional view illustrating a fan-out semiconductor package.

Referring to the drawing, in a fan-out semiconductor package 2100, for example, an external surface of a semiconductor chip 2120 may be protected by an encapsulant 2130, and connection pads 2122 of the semiconductor chip 2120 may be redistributed outwardly of the semiconductor chip 2120 by a interconnection member 2140. In this case, a passivation layer 2150 may further be formed on the interconnection member 2140, and an under-bump metal layer 2160 may further be formed in openings of the passivation layer 2150. Solder balls 2170 may further be formed on the under-bump metal layer 2160. The semiconductor chip 2120 may be an integrated circuit (IC) including a body 2121, the connection pads 2122, a passivation layer (not illustrated), and the like. The interconnection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the interconnection member formed on the semiconductor chip. As described above, in the fan-in semiconductor package, all I/O terminals of the semiconductor chip need to be disposed inside the semiconductor chip. Therefore, when a size of the semiconductor chip is reduced, a size and a pitch of balls need to be reduced, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the interconnection member formed on the semiconductor chip as described above. Therefore, even in the case that a size of the semiconductor chip is reduced, a standardized ball layout may be used in the fan-out semiconductor package as is, such that the fan-out semiconductor package may be mounted on the main board of the electronic device without using a separate interposer substrate, as described below.

Figure 8:
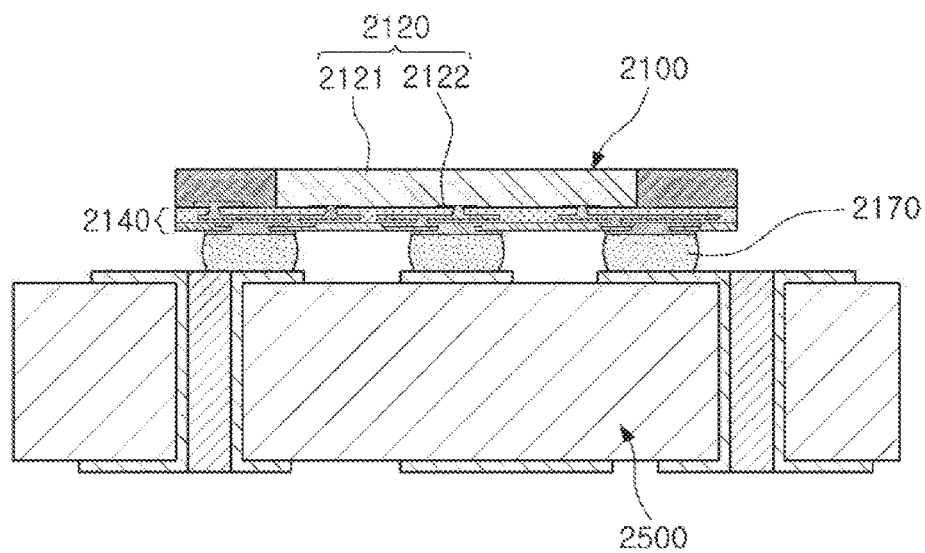
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to the drawing, a fan-out semiconductor package 2100 may be mounted on a main board 2500 of an electronic device through solder balls 2170, or the like. That is, as described above, the fan-out semiconductor package 2100 includes the interconnection member 2140 formed on the semiconductor chip 2120 and capable of redistributing the connection pads 2122 to a fan-out region outside of an area of the semiconductor chip 2120, such that the standardized ball layout may be used in the fan-out semiconductor package 2100 as is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented to have a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type semiconductor package using a printed circuit board (PCB), and may solve a problem occurring due to occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and is conceptually different from a printed circuit board (PCB) such as an interposer substrate, or the like, having a scale, a purpose, and the like, different from those of the fan-out semiconductor package, and having the fan-in semiconductor package embedded therein.

Semiconductor Package Module

Figure 9:
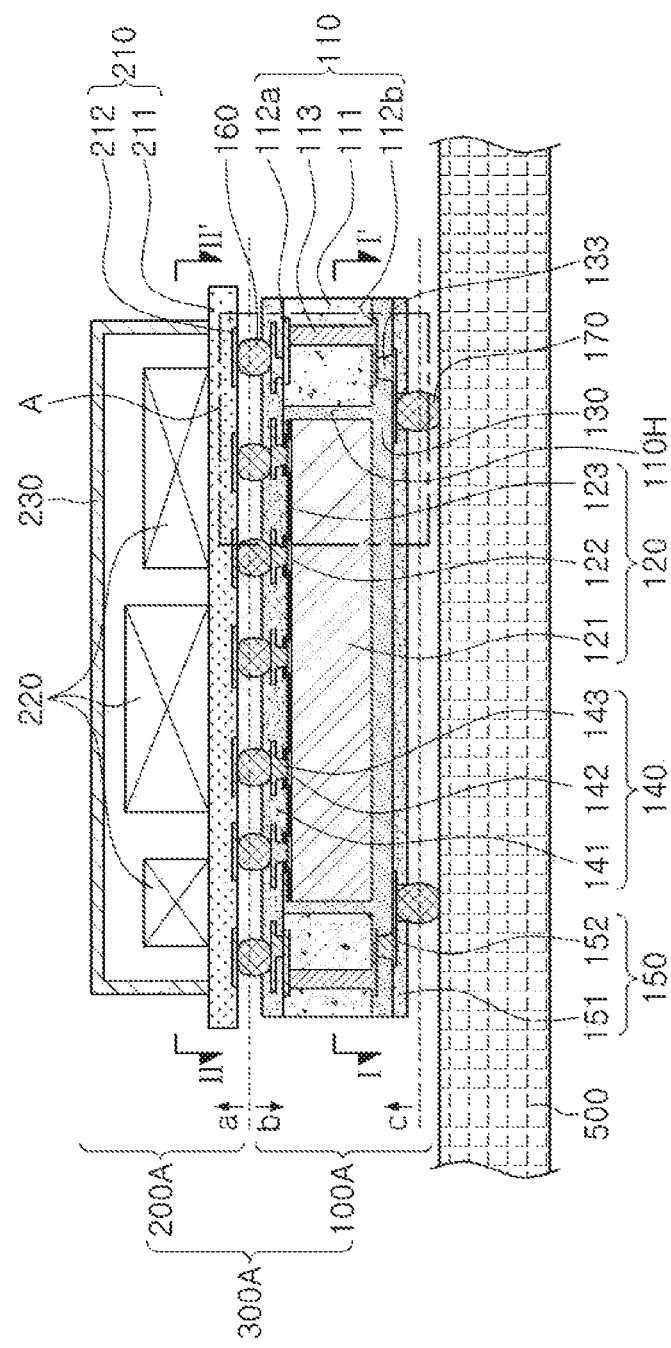
FIG. 9 is a schematic cross-sectional view illustrating an example of a fan-out semiconductor package module.

FIG. 9 is a schematic cross-sectional view illustrating an example of a fan-out semiconductor package module.

Figure 10:
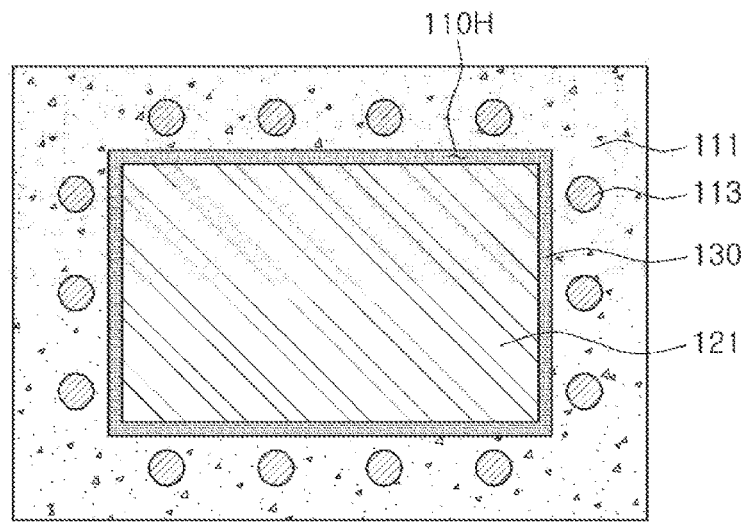
FIG. 10 is a schematic plan view taken along line I-I' of the fan-out semiconductor package module of FIG. 9.

FIG. 10 is a schematic plan view taken along line I-I' of the fan-out semiconductor package module of FIG. 9.

Figure 11:
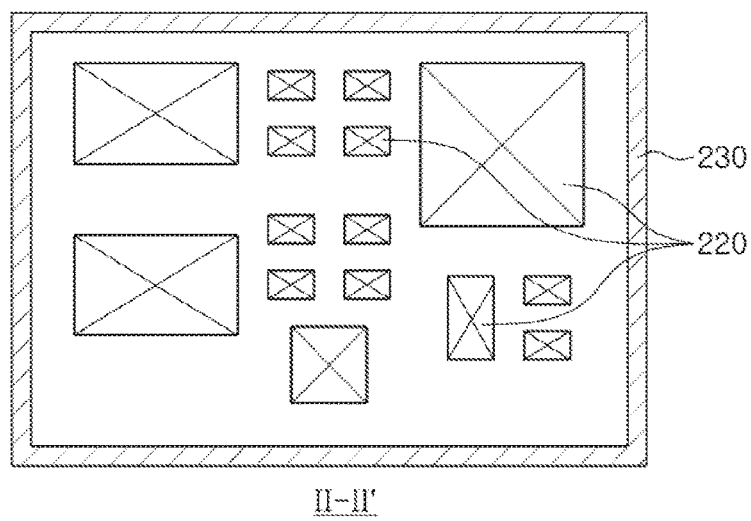
FIG. 11 is a schematic plan view taken along line II-II' of the fan-out semiconductor package module of FIG. 9.

FIG. 11 is a schematic plan view taken along line II-II' of the fan-out semiconductor package module of FIG. 9.

Referring to the drawings, a fan-out semiconductor package module 300A according to an exemplary embodiment in the present disclosure may include a fan-out semiconductor package 100A and a component package 200A disposed on the fan-out semiconductor package 100A. The fan-out semiconductor package 100A may include a first interconnection member 110 having a through-hole 110H, a semiconductor chip 120 disposed in the through-hole 110H and having an active surface having connection pads 122 disposed thereon and an inactive surface opposing the active surface, an encapsulant 130 encapsulating at least portions of the first interconnection member 110 and the inactive surface of the semiconductor chip 120, a second interconnection member 140 disposed on the first interconnection member 110 and the active surface of the semiconductor chip 120, a third interconnection member 150 disposed on the encapsulant 130, first connection terminals 160 disposed on the second interconnection member 140 and connected to the second interconnection member 140, and second connection terminals 170 connected on the third interconnection member 150 and connected to the third interconnection member 150. The component package 200A may include a wiring substrate 210 disposed above the second interconnection member 140 and connected to the second interconnection member 140 through the first connection terminals 160, a plurality of components 220 disposed on the wiring substrate 210, and a protection layer 230 protecting the plurality of components 220.

In a case in which components such as memories, baseband integrated circuits (ICs), radio frequency (RF) ICs (RFICs), power management integrated circuits (PMICs), RF matching components, power terminal bypass components, and the like, currently used in mobile devices, are implemented in a single module, a thickness and a size of the module are significantly large. In some modules, in order to solve this problem, components have been mounted on upper and lower surfaces of a wiring substrate, a sub-wiring substrate has been introduced, and pads for mounting an electronic device on a main board have been formed on the sub-wiring substrate. However, there is a limitation in forms of ICs mounted on the lower surface of the wiring substrate, and there is a problem in reliability. Therefore, a new micro module that has increased functionality and improved reliability has been demanded.

The fan-out semiconductor package module 300A according to the exemplary embodiment may have a structure in which the fan-out semiconductor package 100A is introduced, a main semiconductor chip 120 such as ICs is mounted in the fan-out semiconductor package 100A, and the component package 200A in which various components may be mounted is stacked on the fan-out semiconductor package 100A. Therefore, a micro fan-out semiconductor package module with increased functionality and improved reliability may be provided. In this case, the semiconductor chip 120 may be disposed in a face-up form and may be electrically connected to the wiring substrate 210 and the components 220 of the component package 200A through the second interconnection member 140 and the first connection terminals 160 connected to the second interconnection member 140, resulting in a very short transfer pathway of signals, or the like. In addition, in the fan-out semiconductor package 100A, the first interconnection member 110 in which redistribution layers 112a and 112b, and the like, are formed is introduced into the surroundings of the semiconductor chip 120, and the second connection terminals 170 electrically connected to the encapsulant 130 is introduced below the encapsulant 130, such that the fan-out semiconductor package module 300A may be stably mounted on a main board 500 of an electronic device.

The respective components included in the fan-out semiconductor package module according to the exemplary embodiment will hereinafter be described in more detail.

The first interconnection member 110 may maintain the rigidity of the fan-out semiconductor package 100A, and may serve to secure uniformity of a thickness of the encapsulant 130. In addition, the first interconnection member 110 may provide a routing region in which the redistribution layers 112a and 112b may be formed, thereby reducing the number of layers of the second interconnection member 140 and solving a defect occurring in a process of forming the second interconnection member 140. The first interconnection member 110 may have the through-hole 110H. The through-hole 110H may have the semiconductor chip 120 disposed therein to be spaced apart from the first interconnection member 110 by a predetermined distance. That is, side surfaces of the semiconductor chip 120 may be surrounded by the first interconnection member 110. However, a form of the first interconnection member 110 is not limited thereto, and may be variously modified to have other forms. The first interconnection member 110 may include an insulating layer 111, the redistribution layers 112a and 112b disposed on opposite surfaces of the insulating layer 111, respectively, and vias 113 penetrating through the insulating layer 111 and electrically connecting the redistribution layers 112a and 112b disposed on the opposite surfaces of the insulating layer 111, respectively, to each other.

An insulating material may be used as a material of the insulating layer 111. In this case, the insulating material may be a thermosetting resin such as an epoxy resin, a thermoplastic resin such as a polyimide resin, a resin having a reinforcing material such as a glass cloth or an inorganic filler impregnated in the thermosetting resin and the thermoplastic resin, for example prepreg, Ajinomoto Build up Film (ABF), FR-4, Bismaleimide Triazine (BT), or the like. Alternatively, a photoimagable dielectric (PID) resin may also be used as the insulating material.

The redistribution layers 112a and 112b may serve as redistribution patterns, and a material of each of the redistribution layers 112a and 112b may be a conductive material such as copper (Cu), aluminum (Al), silver (Ag), tin (Sn), gold (Au), nickel (Ni), lead (Pb), titanium (Ti), or alloys thereof. The redistribution layers 112a and 112b may have various functions, depending on designs of layers corresponding thereto. For example, the redistribution layers 112a and 112b may serve as a ground (GND) pattern, a power (PWR) pattern, a signal (S) pattern, and the like. Here, the signal (S) pattern may include various signals except for the ground (GND) pattern, the power (PWR) pattern, and the like, such as data signals, and the like. In addition, the redistribution layers 112a and 112b may serve as a via pad, a connection terminal pad, and the like.

The vias 113 may electrically connect the redistribution layers 112a and 112b formed on different layers to each other, resulting in an electrical pathway in the first interconnection member 110. A material of each of the vias 113 may be a conductive material such as copper (Cu), aluminum (Al), silver (Ag), tin (Sn), gold (Au), nickel (Ni), lead (Pb), titanium (Ti), or alloys thereof. Each of the vias 113 may be entirely filled with the conductive material, or the conductive material may be formed along a wall of respective via holes unlike illustrated in the drawings. In addition, each of the vias 113 may have any known cross-sectional shape such as a tapered shape, a cylindrical shape, or the like.

The semiconductor chip 120 may be an integrated circuit (IC) in a bare state, provided in an amount of several hundreds to several millions of elements or more integrated in a single chip. The IC may be, for example, an application processor chip such as a central processor (for example, a CPU), a graphics processor (for example, a GPU), a digital signal processor, a cryptographic processor, a microprocessor, a microcontroller, or the like, but is not limited thereto.

The semiconductor chip 120 may include a body 121, the connection pads 122 formed on one surface of the body 121, and a passivation layer 123 formed on the body 121 and covering portions of the connection pads 122. The body 121 may be formed on the basis of, for example, an active wafer. In this case, a basic material of the body 121 may be silicon (Si), germanium (Ge), gallium arsenide (GaAs), or the like. The connection pads 122 may electrically connect the semiconductor chip 120 to other components, and a material of each of the connection pads 122 may be a conductive material such as aluminum (Al), or the like. The connection pads 122 may be redistributed by the first interconnection member 110, the second interconnection member 140, the third interconnection member 150, the wiring substrate 210, and the like. A surface of the semiconductor chip 120 on which the connection pads 122 are disposed may be the active surface, and a surface of the semiconductor chip 120 opposing the active surface may be the inactive surface. As an example, the semiconductor chip 120 may be disposed in a face-up form. That is, the active surface on which the connection pads 122 are disposed may be disposed in an upward direction in which the first interconnection member 110 is disposed. The passivation layer 123 may serve to protect the body 121 from external impact, and may be, for example, an oxide film formed of SiO, etc., a nitride film formed of SiN, etc., or the like, or be a double layer including an oxide layer and a nitride layer. In addition, an insulating layer (not illustrated), or the like, formed of SiO, etc., may be further disposed between the body 121 and the connection pads 122 or between the body 121 and the passivation layer 123.

The encapsulant 130 may be configured to protect the first interconnection member 110 and/or the semiconductor chip 120. An encapsulation form of the encapsulant 130 is not particularly limited, but may be a form in which the encapsulant 130 surrounds at least portions of the first interconnection member 110 and/or the semiconductor chip 120. For example, the encapsulant 130 may cover lower surfaces of the first interconnection member 110 and the semiconductor chip 120, and fill spaces between walls of the through-hole 110H and the side surfaces of the semiconductor chip 120. Meanwhile, the encapsulant 130 may fill the through-hole 110H to thus serve as an adhesive and reduce buckling of the semiconductor chip 120 depending on materials thereof.

The materials of the encapsulant 130 are not particularly limited, but may be, for example, an insulating material. In more detail, a material of the encapsulant 130 may be for example, ABF, or the like, that includes an inorganic filler and an insulating resin, but does not include a glass cloth. In a case in which the material that includes the inorganic filler and the insulating resin, but does not include the glass cloth is used as the material of the encapsulant 130, a problem such as a void or delamination may be solved. Meanwhile, the inorganic filler may be a known inorganic filler, and the insulating resin may be a known epoxy resin, or the like.

The second interconnection member 140 may be configured to substantially redistribute the connection pads 122 of the semiconductor chip 120. Several tens to several hundreds of connection pads 122 having various functions may be primarily redistributed by the second interconnection member 140. The second interconnection member 140 may be disposed above the first interconnection member 110 and the semiconductor chip 120. The second interconnection member 140 may include insulating layers 141, redistribution layers 142 disposed on the insulating layers 141, and vias 143 penetrating through the insulating layers 141 and connecting the redistribution layers 142 to each other.

An insulating material may be used as a material of the insulating layers 141. In this case, a photosensitive insulating material such as a photoimagable dielectric (PID) resin may also be used as the insulating material. In this case, the insulating layer 141 may be formed to have a smaller thickness, and a fine pitch of the vias 143 may be achieved more easily. When the insulating layers 141 are multiple layers, materials of the insulating layers 141 may be the same as each other or may be different from each other, as necessary. When the insulating layers 141 are the multiple layers, the insulating layers 141 may be integrated with each other depending on a process, such that a boundary therebetween may not be readily apparent.

The redistribution layers 142 may serve to substantially redistribute the connection pads 122. A material of each of the redistribution layers 142 may be a conductive material such as copper (Cu), aluminum (Al), silver (Ag), tin (Sn), gold (Au), nickel (Ni), lead (Pb), titanium (Ti), or alloys thereof. The redistribution layers 142 may have various functions, depending on designs of layers corresponding thereto. For example, the redistribution layers 142 may include a ground (GND) pattern, a power (PWR) pattern, a signal (S) pattern, and the like. Here, the signal (S) pattern may include various signals except for the ground (GND) pattern, the power (PWR) pattern, and the like, such as data signals, and the like. In addition, the redistribution layers 142 may include a via pad, a connection terminal pad, and the like.

The vias 143 may electrically connect the redistribution layers 142, the connection pads 122, or the like, formed on different layers to each other, resulting in an electrical pathway in the fan-out semiconductor package 100A. A material of each of the vias 143 may be a conductive material such as copper (Cu), aluminum (Al), silver (Ag), tin (Sn), gold (Au), nickel (Ni), lead (Pb), titanium (Ti), or alloys thereof. The each of vias 143 may be entirely filled with the conductive material, or the conductive material may also be formed along a wall of each of the vias. In addition, each of the vias 143 may have any known shape, such as a tapered shape, a cylindrical shape, and the like.

A case in which the second interconnection member 140 has one redistribution layer 142 and the vias 143 is illustrated in the drawing, but the second interconnection member 140 is not limited thereto. That is, the second interconnection member 140 may include a larger number of insulating layers depending on a design thereof, and thus include a larger number of distribution layers and vias. That is, the second interconnection member 140 may also be formed of a plurality of layers.

The third interconnection member 150 may be configured to redistribution the connection pads 122 of the semiconductor chip 120 and provide mounting pads for mounting the fan-out semiconductor package module 300A on the main board 500, or the like, of the electronic device. The third interconnection member 150 may include insulating layers 151 and redistribution layers 152. The third interconnection member 150 may be connected to the redistribution layer 112b of the first interconnection member 110 through the vias 133 penetrating through the encapsulant 130.

A material of the insulating layer 151 is not particularly limited, but may be a photosensitive insulating material such as a PID resin. Alternatively, a solder resist may also be used as a material of the insulating layer 151. Alternatively, an insulating material that includes a filler and a resin, but does not include a glass cloth, such as ABF, or the like, may be used as a material of the insulating layer 151. When the insulating layers 151 are multiple layers, materials of the insulating layers 151 may be the same as each other or may be different from each other, as necessary. When the insulating layers 151 are the multiple layers, the insulating layers 151 may be integrated with each other depending on a process, such that a boundary therebetween may not be readily apparent.

A material of the redistribution layer 152 may be a conductive material such as copper (Cu), aluminum (Al), silver (Ag), tin (Sn), gold (Au), nickel (Ni), lead (Pb), titanium (Ti), or alloys thereof. The redistribution layers 152 may have various functions, depending on designs of layers corresponding thereto. For example, the redistribution layers 152 may include a ground (GND) pattern, a power (PWR) pattern, a signal (S) pattern, and the like. In addition, the redistribution layers 152 may include a via pad, a connection terminal pad, and the like. When the insulating layers 151 are multiple layers, the redistribution layers 152 may also be multiple layers, and the redistribution layers 152 formed on different layers may be electrically connected to each other by vias, or the like, penetrating through the insulating layers 151.

The first connection terminals 160 may be configured to connect the fan-out semiconductor package 100A and the component package 200A to each other. The first connection terminals 160 may be connected to portions of the redistribution layer 142 exposed through openings formed in the second interconnection member 140. The first connection terminals 160 may be for, example, solder balls, copper cored balls, copper posts, or the like, but are not limited thereto. The first connection terminal 160 may have a size smaller than that of the second connection terminal 170.

The second connection terminals 170 may be configured to connect the fan-out semiconductor package module 300A to the main board 500, or the like, of the electronic device. The second connection terminals 170 may be connected to portions of the redistribution layer 152 exposed through openings formed in the third interconnection member 150. Each of the second connection terminals 170 may be formed of a conductive material, for example, a solder, or the like. However, this is only an example, and a material of each of the second connection terminals 170 is not limited thereto. The second connection terminal 170 may be a land, a ball, a pin, or the like. The second connection terminal 170 may be formed as a multilayer or single layer structure. When the second connection terminals 170 are formed as a multilayer structure, the second connection terminals 170 may include a copper (Cu) pillar and a solder. When the second connection terminals 170 are formed as a single layer structure, the second connection terminals 170 may include a tin-silver solder or copper (Cu). However, this is only an example, and the second connection terminals 170 are not limited thereto.

Although not illustrated in the drawings, a metal layer may be further disposed on an inner wall of the through-hole 110H of the first interconnection member 110, if necessary. That is, the side surfaces of the semiconductor chip 120 may also be surrounded by the metal layer. Heat generated from the semiconductor chip 120 may be effectively dissipated upwardly or downwardly of the fan-out semiconductor package 100A through the metal layer, and electromagnetic waves may be effectively blocked by the metal layer. In addition, if necessary, a plurality of semiconductor chips may be disposed in the through-hole 110H of the first interconnection member 110, and the number of through-holes 110H of the first interconnection member 110 may be plural and semiconductor chips may be disposed in the through-holes, respectively. In addition, separate passive components such as a condenser, an inductor, and the like, may be disposed together with the semiconductor chip in the through-hole 110H.

The wiring substrate 210 may be a known printed circuit board (PCB) such as an interposer substrate. The wiring substrate 210 may include an insulating layer 211 and redistribution layers 212 formed on the insulating layer 211. Although not illustrated in detail in the drawings, various kinds of redistribution layers 212 may be formed in the insulating layer 211.

The insulating layer 211 may include an insulating material. In this case, the insulating material may be a thermosetting resin such as an epoxy resin, a thermoplastic resin such as a polyimide resin, a resin having a reinforcing material such as a glass cloth or an inorganic filler impregnated in the thermosetting resin and the thermoplastic resin, for example, prepreg, Ajinomoto Buildup Film (ABF), FR-4, Bismaleimide Triazine (BT), or the like. Alternatively, a photoimagable dielectric (PID) resin may also be used as the insulating material.

The redistribution layers 212 may serve as redistribution patterns. A material of each of the redistribution layers 212 may be a conductive material such as copper (Cu), aluminum (Al), silver (Ag), tin (Sn), gold (Au), nickel (Ni), lead (Pb), titanium (Ti), or alloys thereof. The redistribution layers 212 may have various functions, depending on designs of layers corresponding thereto. For example, the redistribution layers 212 may include a ground (GND) pattern, a power (PWR) pattern, a signal (S) pattern, and the like. Here, the signal (S) pattern may include various signals except for the ground (GND) pattern, the power (PWR) pattern, and the like, such as data signals, and the like. In addition, the redistribution layers 212 may include a via pad, a connection terminal pad, and the like.

The components 220 may be various kinds of electronic components. For example, the components 220 may be various kinds of active components, passive components, or the like. In some cases, chip components such as memory chips, and the like, may be disposed as the components 220. That is, certain kinds of components 220 are not particularly limited. The number of components 220 is not particularly limited, and a plurality of components 220 may be disposed in various forms.

The protection layer 230 may be configured to protect the components 220 disposed on the wiring substrate 210, and may be a known metal cover accommodating the components 220 therein or be a known molding material covering the components 220 unlike illustrated in the drawings. A material of the metal cover or the molding material is not particularly limited, but may be the materials known in the related art.

Figure 12:
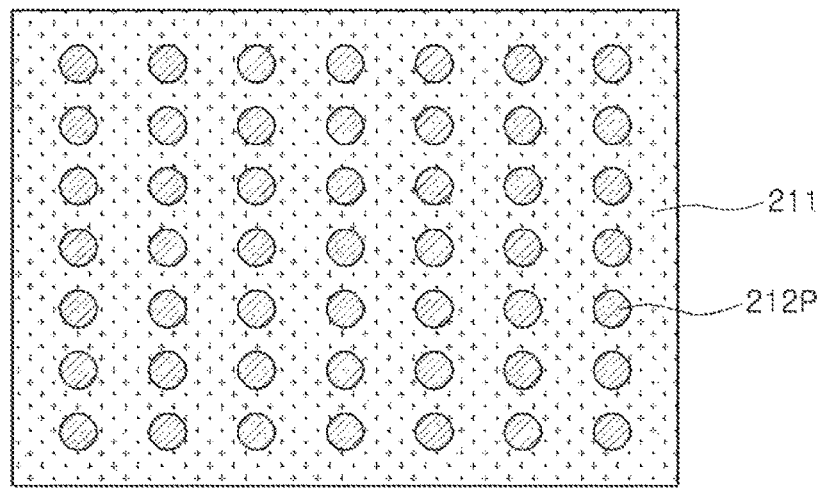
FIG. 12 is a schematic plan view when viewed in direction a of the fan-out semiconductor package module of FIG. 9.

FIG. 12 is a schematic plan view when viewed in direction a of the fan-out semiconductor package module of FIG. 9.

Figure 13:
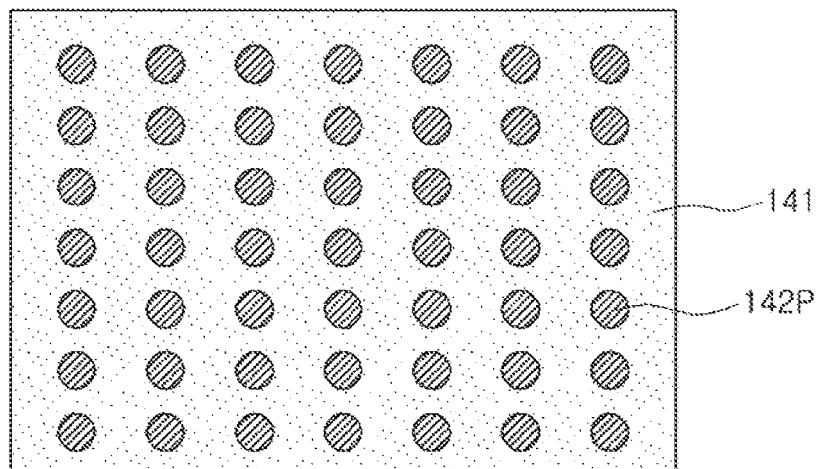
FIG. 13 is a schematic plan view when viewed in direction b of the fan-out semiconductor package module of FIG. 9.

FIG. 13 is a schematic plan view when viewed in direction b of the fan-out semiconductor package module of FIG. 9.

Figure 14:
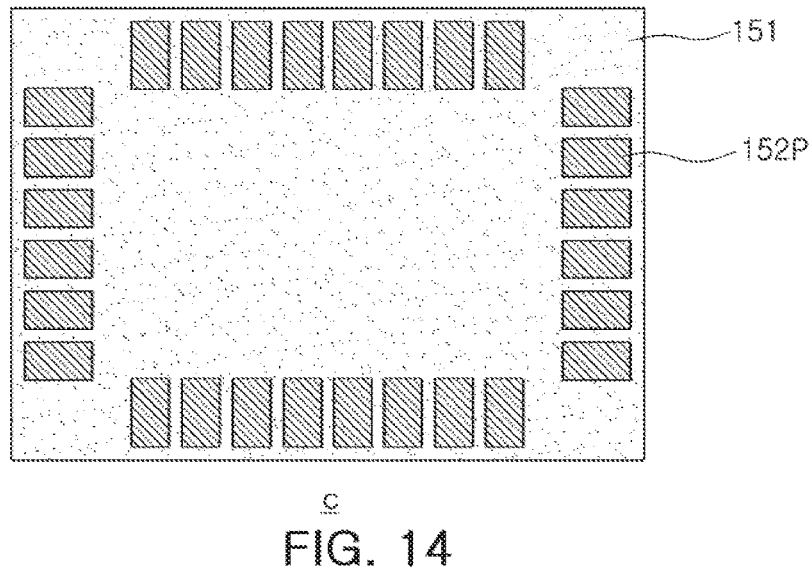
FIG. 14 is a schematic plan view when viewed in direction c of the fan-out semiconductor package module of FIG. 9.

FIG. 14 is a schematic plan view when viewed in direction c of the fan-out semiconductor package module of FIG. 9.

Referring to the drawings, connection terminal pads 212P exposed outwardly of the insulating layer 211 from the redistribution layer 212 of the wiring substrate 210 and connection terminal pads 142P exposed outwardly of the insulating layer 141 of the second interconnection member 140 may be connected to each other by the first connection terminals 160. Therefore, the numbers, positions, forms, and the like, of connection terminal pads 212P of the wiring substrate 210 and connection terminal pads 142P of the second interconnection member 140 may correspond to each other. In addition, connection terminal pads 152P exposed outwardly of the insulating layer 151 from the redistribution layer 152 of the third interconnection member 150 may be connected to the second connection terminals 170. Therefore, the numbers, positions, forms, and the like, of connection terminal pads 152P of the third interconnection member 150 may correspond to those of second connection terminals 170.

Meanwhile, when a region corresponding to a region in which the semiconductor chip 120 is disposed is a fan-in region and a region surrounding the fan-in region is a fan-out region, the connection terminal pads 212P of the wiring substrate 210 and the connection terminal pads 142P of the second interconnection member 140 may be disposed in both of the fan-in region and the fan-out region to connect a plurality of I/O terminals to each other, but are not limited thereto. In addition, the connection terminal pads 152P of the third interconnection member 150 may only be disposed in the fan-out region or a boundary between the fan-in region and the fan-out region. Therefore, the number of connection terminal pads 142P of the second interconnection member 140 connected to the first connection terminal 160 may be greater than that of connection terminal pads 152P of the third interconnection member 150 connected to the second connection terminals 170, but is not limited thereto. Meanwhile, various separate surface mount technology (SMT) components (not illustrated) may be disposed in various forms in the fan-in region in which the connection terminal pads 152P of the insulating layer 151 are not formed, but are not limited thereto.

Meanwhile, the first connection terminals 160 may have a bump shape rather than a ball shape, and the connection terminal pads 212P of the wiring substrate 210 and the connection terminal pads 142P of the second interconnection member 140 may thus be formed in shapes of bump pads having sizes smaller than those of ball pads rather than the ball pads. In this case, a design of a power plane in a region except pads may be facilitated, such that power integrity (PI) characteristics may be secured.

Figure 15:
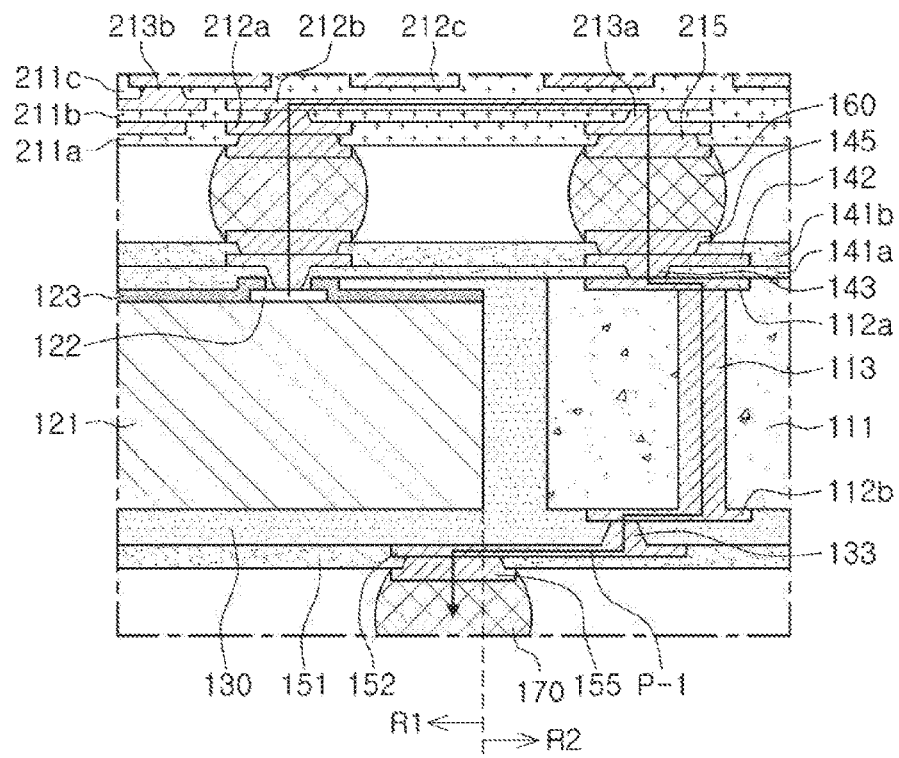
FIG. 15 is a schematic enlarged cross-sectional view of region A of FIG. 9.

FIG. 15 is a schematic enlarged cross-sectional view of region A of FIG. 9.

Referring to the drawing, at least one connection pad 122 and second connection terminal 170 may be connected to each other by an electrical pathway P-1 passing through the wiring substrate 210 and the first interconnection member 110. For example, at least one of the connection pads 122 of the semiconductor chip 120 may be electrically connected to at least one of the second connection terminals 170 through the electrical pathway P-1 traversing the second interconnection member 140, the first connection terminal 160, the wiring substrate 210, the first connection terminal 160, the second interconnection member 140, and the first interconnection member 110 in sequence or in the opposite sequence. The second connection terminal 170 connected to the electrical pathway P-1 may be disposed in a fan-in region R1, be disposed in a fan-out region R2, or be disposed between the fan-in region R1 and the fan-out region R2. In a case in which the number of electrical pathways is plural, a plurality of electrical pathways may be disposed in both of the fan-in region R1 and the fan-out region R2.

In a case in which the connection pad 122 and the second connection terminal 170 are connected to each other by the electrical pathway P-1 traversing the wiring substrate 210 and the first interconnection member 110 as described above, both of the wiring substrate 210 and the first interconnection member 110 may serve to redistribute the connection pad 122, and the second interconnection member 140 may thus be simplified. Therefore, several problems occurring in a process of forming the second interconnection member 140, for example, a yield problem of the semiconductor chip 120 may be solved. For example, the connection pad 122 connected to the electrical pathway P-1 may be a power connection pad or a ground connection pad. In this case, when redistribution layers 212a and 212b, and the like, of the wiring substrate 210 providing the electrical pathway P-1 include power patterns or ground patterns, the redistribution layers 212a and 212b may be utilized to redistribute the power connection pad or the ground connection pad. Therefore, the numbers of power patterns or ground patterns in the second interconnection member 140 may be significantly reduced. Resultantly, the second interconnection member 140 may be simplified, and the remaining region may be utilized for another purpose.

In addition, since the connection pad 122 and the second connection terminal 170 are connected to each other by the electrical pathway P-1 that is meandering, stress transferred through the second connection terminal 170 is offset through the electrical pathway P-1, such that connection reliability, or the like, of the via 143, or the like, connected to the connection pad 122 may be improved. In addition, since the semiconductor chip 120 is disposed in face-up form, even though an underfill process for improving reliability of the second connection terminals 170 when the fan-out semiconductor package module 300A is mounted on the main board of the electronic device is performed, it may be difficult for Cl⁻ ions included in an underfill material to corrode the connection pads 122 of the semiconductor chip 120.

Meanwhile, the second interconnection member 140 may include a plurality of insulating layers 141a and 141b. The plurality of insulating layers 141a and 141b may include the same insulating material or different insulating materials. Openings exposing at least portions of patterns serving as connection terminal pads in the redistribution layer 142 may be formed in an upper insulating layer 141b, and an under-bump metal layer 145 may be formed in the openings. The wiring substrate 210 may include a plurality of insulating layers 211a, 211b, and 211c, a plurality of redistribution layers 212a, 212b, and 212c, and a plurality of vias 213a and 213b, and the plurality of insulating layers 211a, 211b, and 211c may include the same insulating material or different insulating materials. Openings exposing at least portions of patterns serving as connection terminal pads in the redistribution layer 212a may be formed in a lower insulating layer 211a, and an under-bump metal layer 215 may be formed in the openings. Openings exposing at least portions of patterns serving as connection terminal pads in the redistribution layer 152 may be formed in the third interconnection member 150, and an under-bump metal layer 155 may be formed in the openings.

Figure 16:
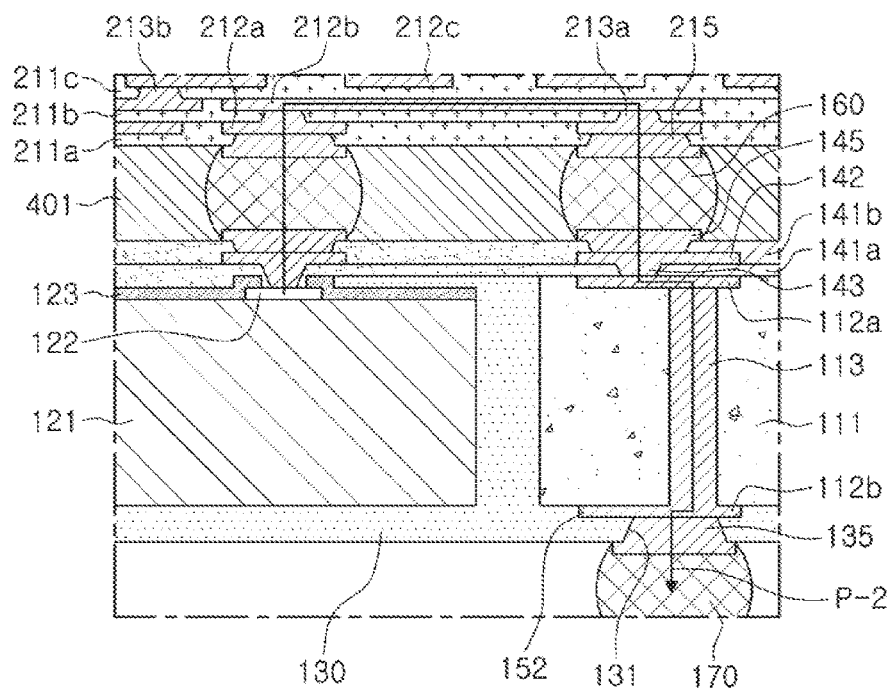
FIG. 16 is a modified schematic enlarged cross-sectional view of region A of FIG. 9.

FIG. 16 is a modified schematic enlarged cross-sectional view of region A of FIG. 9.

Referring to the drawing, a third interconnection member 150 may also be omitted. That is, second connection terminals 170 may be disposed directly below a redistribution layer 112b of a first interconnection member 110, and may be connected to the redistribution layer 112b using an under-bump metal layer 135 formed in openings 131 formed in a lower surface of an encapsulant 130. Therefore, at least one of connection pads 122 may be redistributed to a fan-out region through an electrical pathway P-2. If necessary, an underfill resin may be formed between a second interconnection member 140 and a wiring substrate 210 to surround first connection terminals 160. Therefore, reliability of the first connection terminals 160 may be improved. Other configurations may overlap those described above, and thus, descriptions thereof are omitted.

Figure 17:
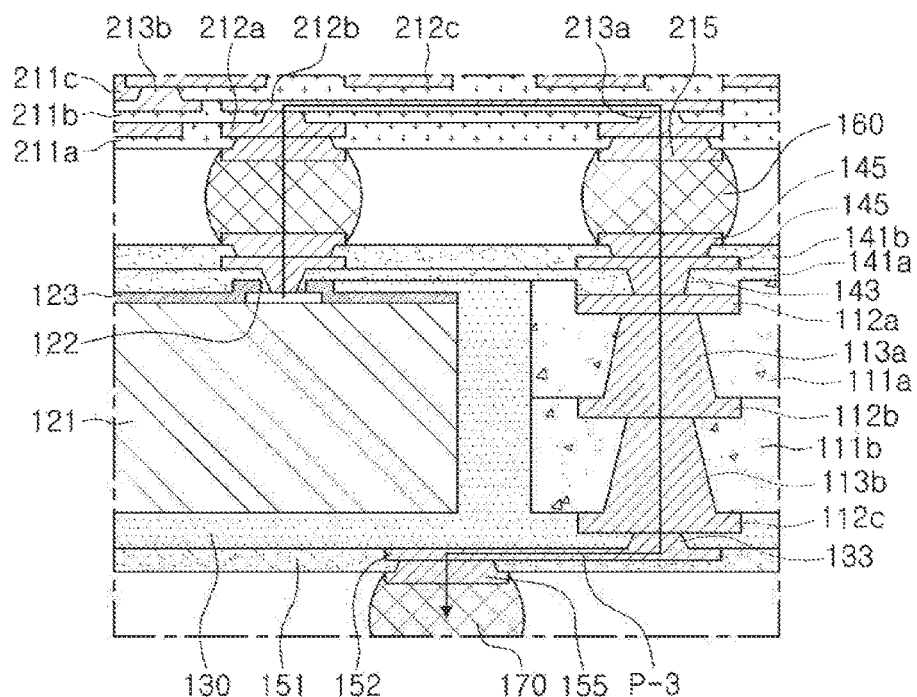
FIG. 17 is a modified schematic enlarged cross-sectional view of region A of FIG. 9.

FIG. 17 is a modified schematic enlarged cross-sectional view of region A of FIG. 9.

Referring to the drawing, a first interconnection member 110 may include a first insulating layer 111a in contact with a second interconnection member 140, a first redistribution layer 112a in contact with the second interconnection member 140 and embedded in the first insulating layer 111a, a second redistribution layer 112b disposed on the other surface of the first insulating layer 111a opposing one surface of the first insulating layer 111a in which the first redistribution layer 112a is embedded, a second insulating layer 111b disposed on the first insulating layer 111a and covering the second redistribution layer 112b, and a third redistribution layer 112c disposed on the second insulating layer 111b. Since the first interconnection member 110 may include a large number of redistribution layers 112a, 112b, and 112c, the second interconnection member 140 may be further simplified. Therefore, a decrease in a yield depending on a defect occurring in a process of forming the second interconnection member 140 may be improved. Since the first redistribution layer 112a is embedded in the first insulating layer 111a, an insulating distance of an insulating layer 141a of the second interconnection member 140 may be relatively constant. The first redistribution layer 112a may be recessed in the first insulating layer 111a, such that a lower surface of the first insulating layer 111a may have a step with respect to a lower surface of the first redistribution layer 112a. Resultantly, a phenomenon in which the encapsulant 130 bleeds into the first redistribution layer 112a may be prevented. The first to third redistribution layers 112a, 112b, and 112c may be electrically connected to each other by first and second vias 113a and 113b penetrating through the first and second insulating layers 111a and 111b. At least one of connection pads 122 may be redistributed to a fan-in region and/or a fan-out region through an electrical pathway P-3 traversing the first interconnection member 110.

Meanwhile, an upper surface of the first redistribution layer 112a of the first interconnection member 110 may be disposed on a level below an upper surface of the connection pad 122 of the semiconductor chip 120. In addition, a distance between a redistribution layer 142 of the second interconnection member 140 and the first redistribution layer 112a of the first interconnection member 110 may be greater than that between the redistribution layer 142 of the second interconnection member 140 and the connection pad 122 of the semiconductor chip 120. Here, the first redistribution layer 112a may be recessed into the first insulating layer 111a. The second redistribution layer 112b of the first interconnection member 110 may be disposed on a level between an active surface and an inactive surface of the semiconductor chip 120. The first interconnection member 110 may be formed at have a thickness corresponding to that of the semiconductor chip 120. Therefore, the second redistribution layer 112b formed in the first interconnection member 110 may be disposed on a level between the active surface and the inactive surface of the semiconductor chip 120.

In addition, thicknesses of the redistribution layers 112a, 112b, and 112c of the first interconnection member 110 may be greater than that of the redistribution layer 142 of the second interconnection member 140. Since the first interconnection member 110 may have a thickness equal to or greater than that of the semiconductor chip 120, the redistribution layers 112a, 112b, and 112c may be formed to be large depending on a scale of the first interconnection member 110. On the other hand, the redistribution layer 142 of the second interconnection member 140 may be formed to be relatively small for thinness. Other configurations may overlap those described above, and thus, descriptions thereof are omitted.

Figure 18:
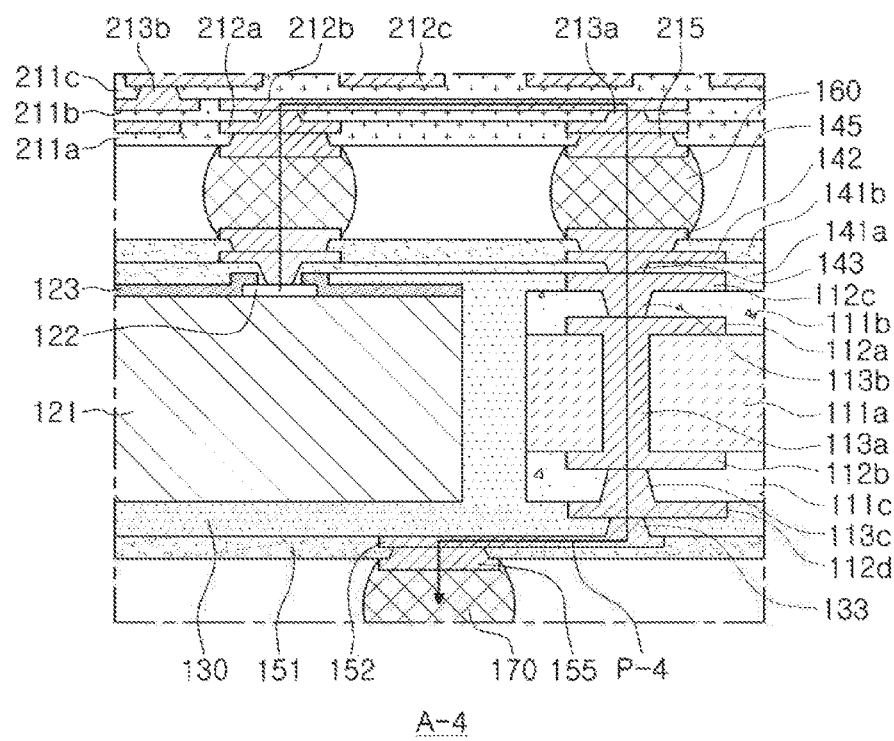
FIG. 18 is a modified schematic enlarged cross-sectional view of region A of FIG. 9.

FIG. 18 is a modified schematic enlarged cross-sectional view of region A of FIG. 9.

Referring to the drawing, a first interconnection member 110 may include a first insulating layer 111a, a first redistribution layer 112a and a second redistribution layer 112b disposed on opposite surfaces of the first insulating layer 111a, respectively, a second insulating layer 111b disposed on the first insulating layer 111a and covering the first redistribution layer 112a, a third redistribution layer 112c disposed on the second insulating layer 111b, a third insulating layer 111c disposed on the first insulating layer 111a and covering the second redistribution layer 112b, and a fourth redistribution layer 112d disposed on the third insulating layer 111c. The first to fourth redistribution layers 112a, 112b, 112c, and 112d may be electrically connected to each other by first to third vias 113a, 113b, and 113c each penetrating through the first to third insulating layers 111a, 111b, and 111c. Since the first interconnection member 110 may include a larger number of redistribution layers 112a, 112b, 112c, and 112d, a second interconnection member 140 may be further simplified, such that a decrease in a yield generated in a process of forming the second interconnection member 140 may be improved. At least one of connection pads 122 may be redistributed to a fan-in region and/or a fan-out region through an electrical pathway P-4 traversing the first interconnection member 110.

Meanwhile, the first insulating layer 111a may have a thickness greater than those of the second insulating layer 111b and the third insulating layer 111c. The first insulating layer 111a may basically be relatively thick in order to maintain rigidity, and the second and third insulating layers 111b and 111c may be disposed in order to form a larger number of redistribution layers 112c and 112d. The first insulating layer 111a may include an insulating material different from those of the second insulating layer 111b and the third insulating layer 111c. For example, the first insulating layer 111a may be formed of, for example, prepreg including a glass cloth, an inorganic filler, and an insulating resin, and the second and third insulating layers 111b and 111c may be formed of an ABF or a photosensitive insulating film including an inorganic filler and an insulating resin. However, the materials of the first insulating layer 111a and the second and third insulating layers 111b and 111c are not limited thereto.

In addition, an upper surface of the third redistribution layer 112c of the first interconnection member 110 may be disposed on a level above an upper surface of the connection pad 122 of a semiconductor chip 120. A distance between a redistribution layer 142 of the second interconnection member 140 and the third redistribution layer 112c of the first interconnection member 110 may be smaller than that between the redistribution layer 142 of the second interconnection member 140 and the connection pad 122 of the semiconductor chip 120. Here, the third redistribution layer 112c may be disposed in a protruding form on the second insulating layer 111b, resulting in contact with the second interconnection member 140. The first interconnection member 110 may be formed at have a thickness corresponding to that of the semiconductor chip 120. Therefore, the first redistribution layer 112a and the second redistribution layer 112b formed in the first interconnection member 110 may be disposed on a level between an active surface and an inactive surface of the semiconductor chip 120.

In addition, thicknesses of the redistribution layers 112a, 112b, 112c, and 112d of the first interconnection member 110 may be greater than that of the redistribution layer 142 of the second interconnection member 140. Since the first interconnection member 110 may have a thickness equal to or greater than that of the semiconductor chip 120, the redistribution layers 112a, 112b, 112c, and 112d may also be formed to have large sizes. On the other hand, the redistribution layer 142 of the second interconnection member 140 may be formed to be relatively small for thinness. Other configurations may overlap those described above, and thus, descriptions thereof are omitted.

Figure 19:
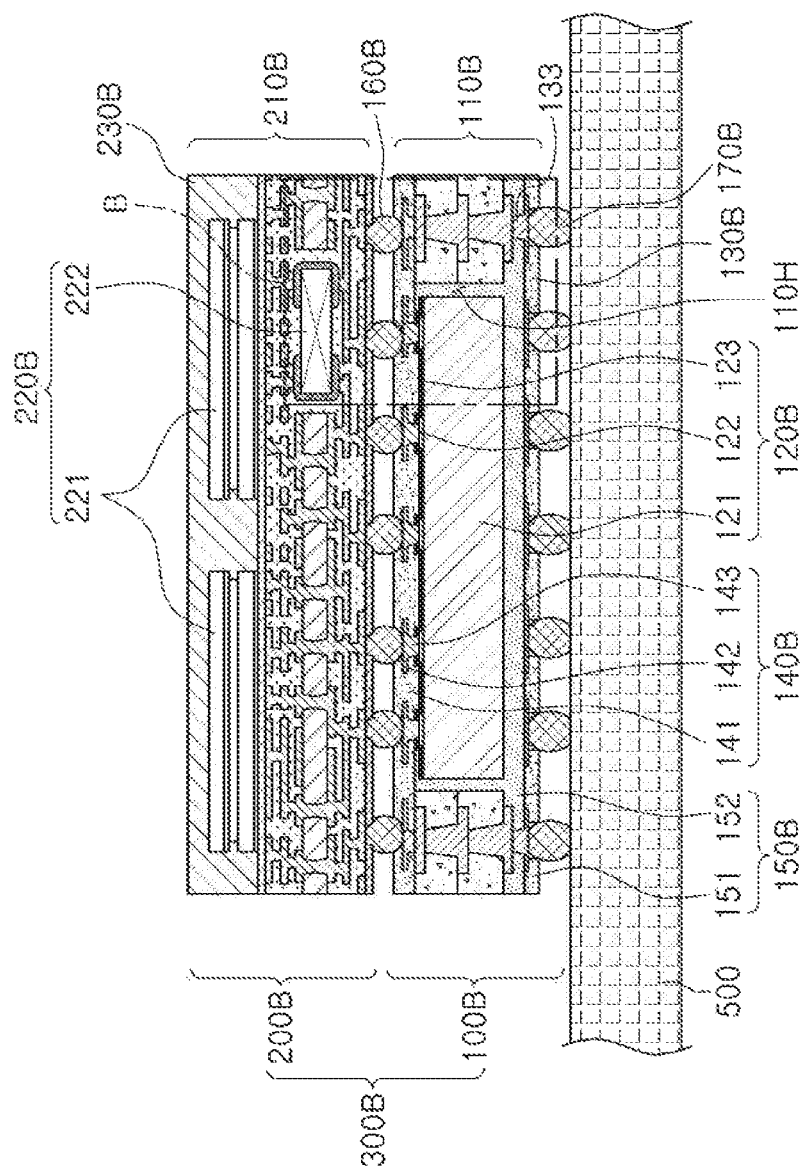
FIG. 19 is a schematic cross-sectional view illustrating another example of a fan-out semiconductor package module.

FIG. 19 is a schematic cross-sectional view illustrating another example of a fan-out semiconductor package module.

Figure 20:
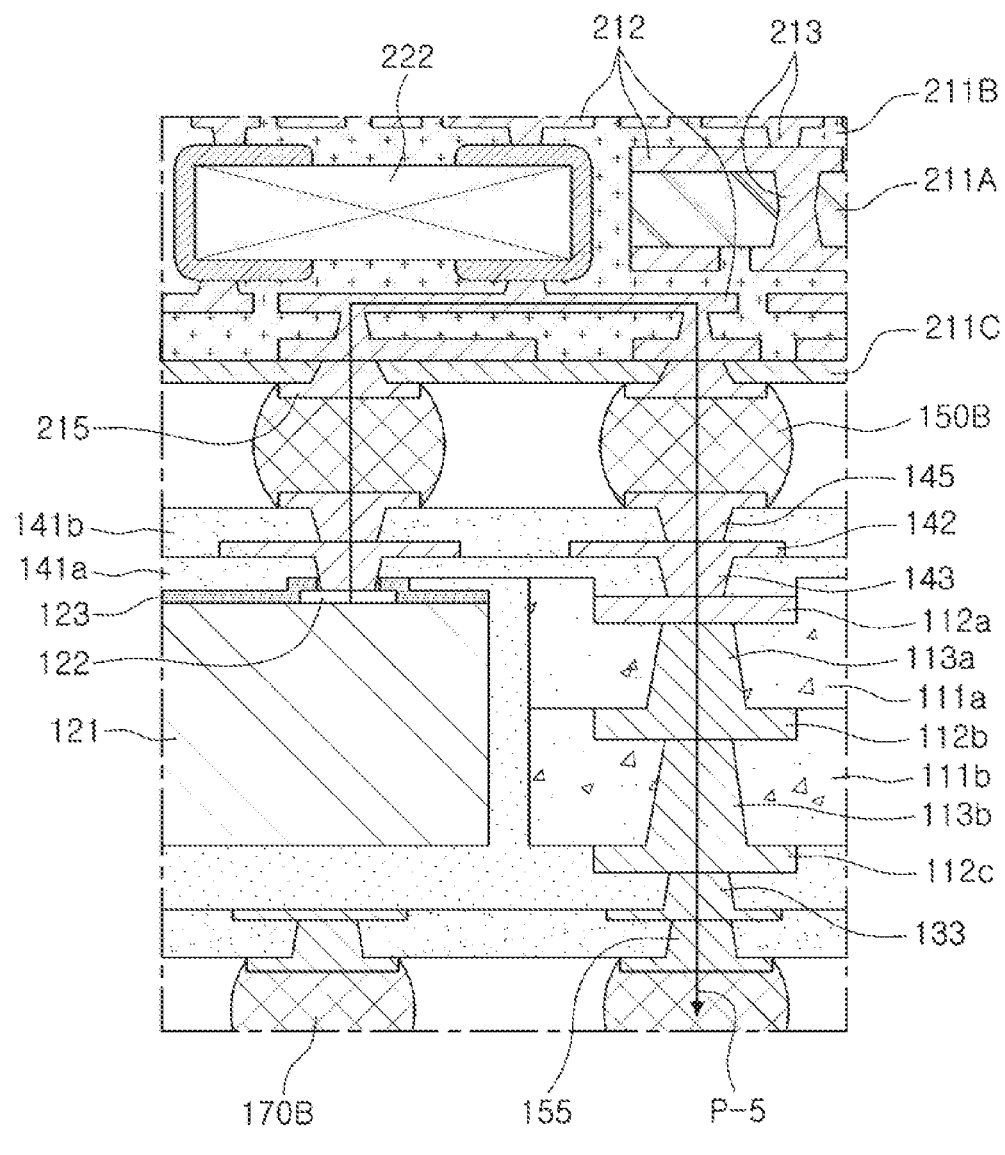
FIG. 20 is a schematic enlarged cross-sectional view of region B of FIG. 19.

FIG. 20 is a schematic enlarged cross-sectional view of region B of FIG. 19.

Referring to the drawings, a fan-out semiconductor package module 300B according to the present exemplary embodiment in the present disclosure may include a fan-out semiconductor package 100B and a component package 200B disposed on the fan-out semiconductor package 100B. The fan-out semiconductor package 100B may include a first interconnection member 110B having a through-hole 110H, a semiconductor chip 120B disposed in the through-hole 110H and having an active surface having connection pads 122 disposed thereon and an inactive surface opposing the active surface, an encapsulant 130B encapsulating at least portions of the first interconnection member 110B and the inactive surface of the semiconductor chip 120B, a second interconnection member 140B disposed on the first interconnection member 110B and the active surface of the semiconductor chip 120B, a third interconnection member 150B disposed on the encapsulant 130B, first connection terminals 160B disposed on the second interconnection member 140B and connected to the second interconnection member 140B, and second connection terminals 170B connected on the third interconnection member 150B and connected to the third interconnection member 150B. The component package 200B may include a wiring substrate 210B disposed above the second interconnection member 140B and connected to the second interconnection member 140B through the first connection terminals 160B, a plurality of components 220B disposed on the wiring substrate 210B or embedded in the wiring substrate 210B, and a protection layer 230B protecting memory chips 221, and the like, disposed on the wiring substrate 210B.

The fan-out semiconductor package module 300B according to the present exemplary embodiment may have a structure in which the fan-out semiconductor package 100B is introduced, a main semiconductor chip 120B such as ICs is mounted in the fan-out semiconductor package 100B, and the component package 200B in which the memory chips 221, and the like, may be mounted is stacked on the fan-out semiconductor package 100B. Therefore, a micro fan-out semiconductor package module that does has increased functionality and improved reliability may be provided. In this case, the semiconductor chip 120B may be disposed in a face-up form and be electrically connected to the wiring substrate 210B and the components 220B of the component package 200B through the second interconnection member 140B and the first connection terminals 160B connected to the second interconnection member 140B, resulting in a very short transfer pathway of signals, or the like. In addition, in the fan-out semiconductor package 100B, the first interconnection member 110B in which redistribution layers 112a, 112b, and 112c, and the like, are formed is introduced in the surrounding of the semiconductor chip 120B, and the second connection terminals 170B electrically connected to the encapsulant 130B is introduced below the encapsulant 130B, such that the fan-out semiconductor package module 300B may be stably mounted on a main board 500 of an electronic device.

The respective components included in the fan-out semiconductor package module according to the present exemplary embodiment will hereinafter be described in more detail, but a description of contents overlapping those described above will be omitted.

Referring to the drawings, at least one connection pad 122 and second connection terminal 170B may be connected to each other by an electrical pathway P-5 traversing the wiring substrate 210B and the first interconnection member 110B. For example, at least one of the connection pads 122 of the semiconductor chip 120B may be electrically connected to at least one of the second connection terminals 170B through the electrical pathway P-5 traversing the second interconnection member 140B, the first connection terminal 160B, the wiring substrate 210B, the first connection terminal 160B, the second interconnection member 140B, and the first interconnection member 110B in sequence or in the opposite sequence. In this case, the electrical pathway P-5 may be connected to a passive component 222 such as an embedded capacitor, an embedded power inductor, or the like, embedded in the wiring substrate 210B. As described above, the semiconductor chip 120B may be connected to the embedded passive component 222 through the electrical pathway P-5 which is short, which is advantageous in securing power integrity (PI) characteristics. Meanwhile, the semiconductor chip 120B is not necessarily electrically connected to the passive component 222 through only the electrical pathway P-5 described above, but may also be electrically connected to the passive component 222 through another pathway. In addition, in a case in which the passive component 222 is embedded in the wiring substrate 210B and is connected to the semiconductor chip 120B as described above, a separate land side capacitor (LSC) does not need to be disposed below the fan-out semiconductor package 100B, and a height of the second connection terminals 170B may thus be lowered. In addition, memory signals of the semiconductor chip 120B disposed in the face-up form may be connected to the memory chips 221 at a short distance through the wiring substrate 210B, which may be advantageous in characteristics of memories.

The second interconnection member 140B may include a plurality of insulating layers 141a and 141b. The plurality of insulating layers 141a and 141b may include the same insulating material or different insulating materials. Openings exposing at least portions of patterns serving as connection terminal pads in the redistribution layer 142 may be formed in an upper insulating layer 141b, and an under-bump metal layer 145 may be formed in the openings. The wiring substrate 210B may include a first insulating layer 211A having a cavity in which the passive component 222 is embedded, a second insulating layer 211B covering one surface of the first insulating layer 211A, and a third insulating layer 211C covering the other surface of the first insulating layer 211A. In addition, the wiring substrate 210B may include redistribution layers 212 and vias 213 formed on and in the first insulating layer 211A and the second insulating layer 211B. The first insulating layer 211A may be a known core layer formed of prepreg, or the like, the second insulating layer 211B may be a known insulating film formed of ABF, or the like, and the third insulating layer 211C may be a known PID film formed of solder resist, or the like. However, the first to third insulating layers are not limited thereto. The wiring substrate 210B may include an under-bump metal layer 215 connected to the other first connection terminals 160B. The second connection terminals 170B may be disposed in both of a fan-in region and a fan-out region through the third interconnection member 150B, but are not limited thereto.

Although not illustrated in the drawings, the fan-out semiconductor package module 300B according to the present exemplary embodiment may be variously modified as in the modified examples of the fan-out semiconductor package module 300A according to the exemplary embodiment described above.

Figure 21:
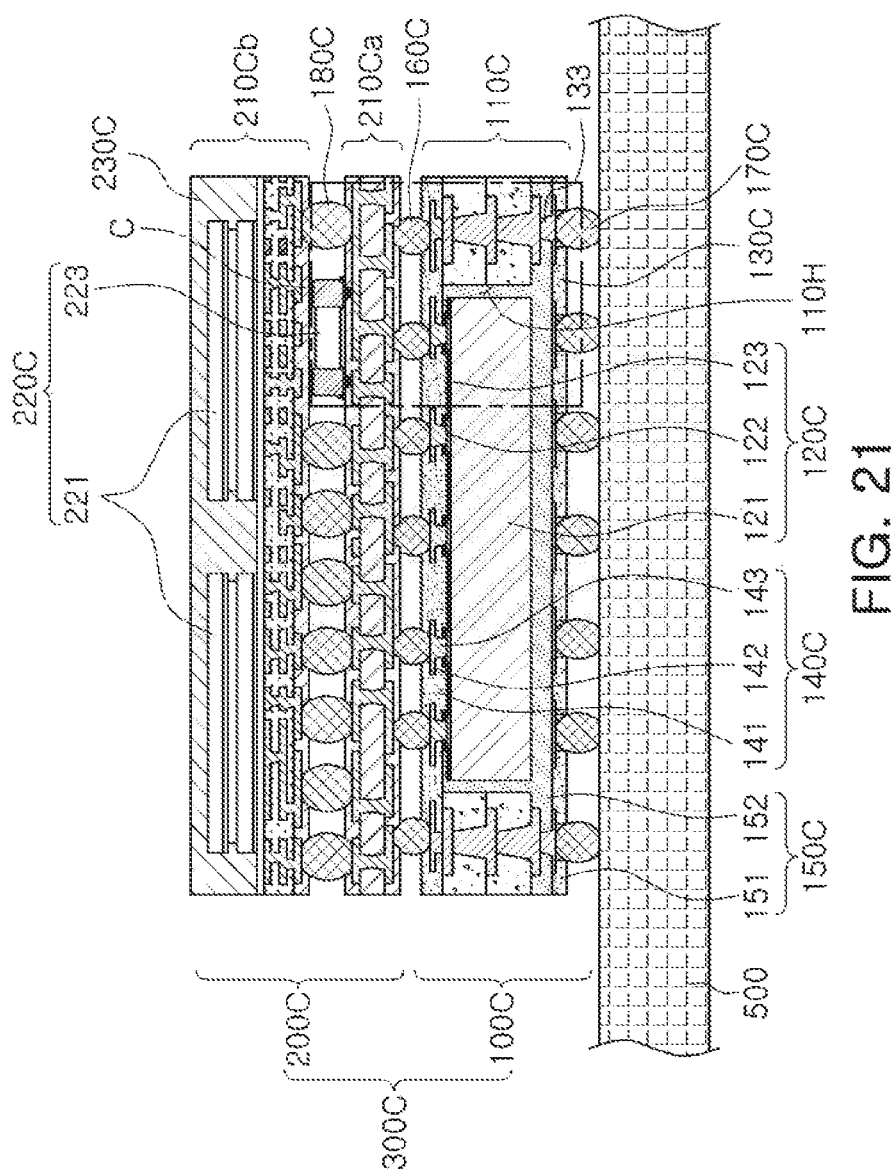
FIG. 21 is a schematic cross-sectional view illustrating another example of a fan-out semiconductor package module.

FIG. 21 is a schematic cross-sectional view illustrating another example of a fan-out semiconductor package module.

Figure 22:
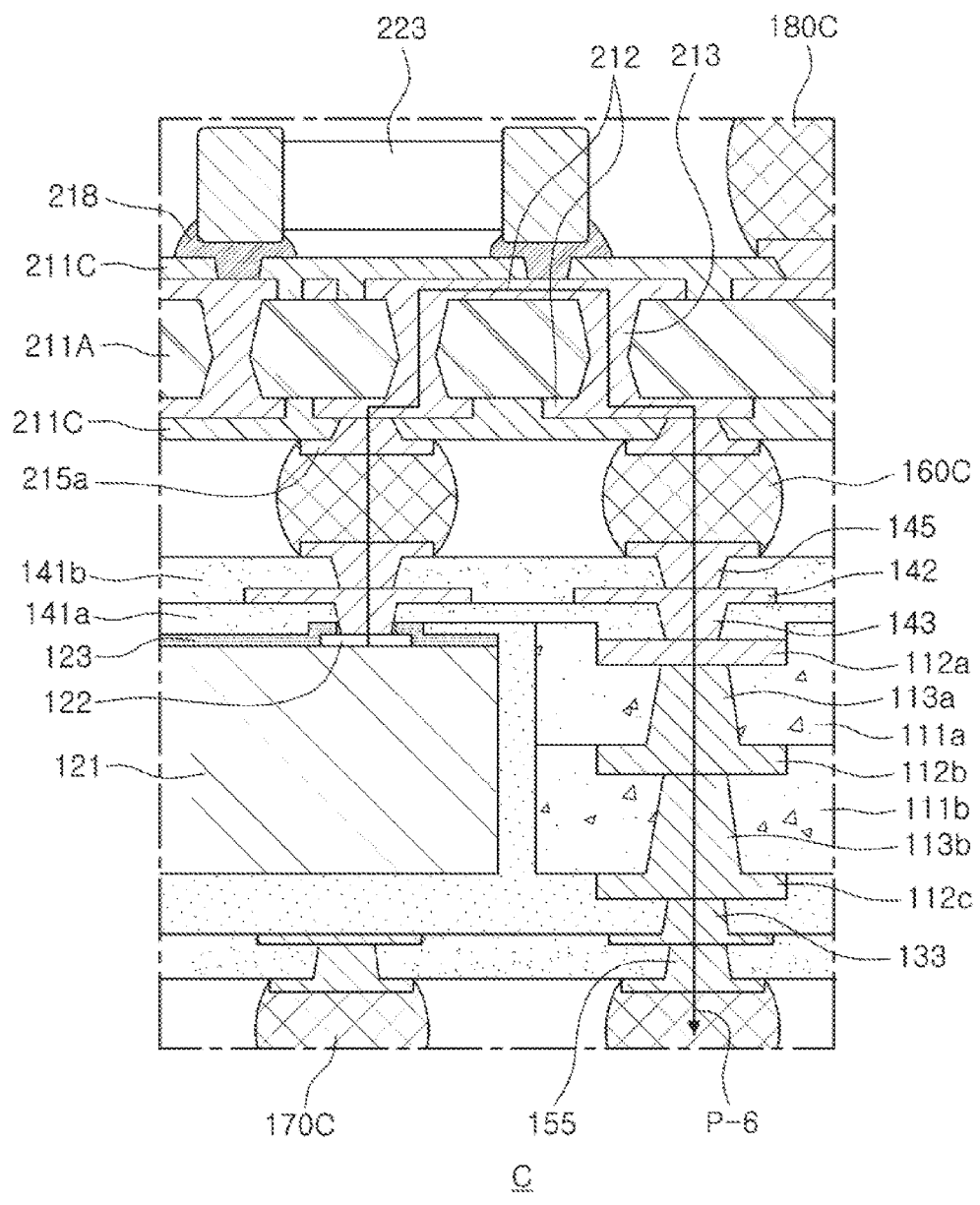
FIG. 22 is a schematic enlarged cross-sectional view of region C of FIG. 21.

FIG. 22 is a schematic enlarged cross-sectional view of region C of FIG. 21.

Referring to the drawings, a fan-out semiconductor package module 300C according to the present exemplary embodiment in the present disclosure may include a fan-out semiconductor package 100C and a component package 200C disposed on the fan-out semiconductor package 100C. The fan-out semiconductor package 100C may include a first interconnection member 110C having a through-hole 110H, a semiconductor chip 120C disposed in the through-hole 110H and having an active surface having connection pads 122 disposed thereon and an inactive surface opposing the active surface, an encapsulant 130C encapsulating at least portions of the first interconnection member 110C and the inactive surface of the semiconductor chip 120C, a second interconnection member 140C disposed on the first interconnection member 110C and the active surface of the semiconductor chip 120C, a third interconnection member 150C disposed on the encapsulant 130C, first connection terminals 160C disposed on the second interconnection member 140C and connected to the second interconnection member 140C, and second connection terminals 170C connected on the third interconnection member 150C and connected to the third interconnection member 150C. The component package 200C may include a first wiring substrate 210Ca disposed above the second interconnection member 140C and connected to the second interconnection member 140C through the first connection terminals 160C, a second wiring substrate 210Cb disposed above the first wiring substrate 210Ca and connected to the first wiring substrate 210Ca through third connection terminals 180C, components 220C disposed on the first wiring substrate 210Ca or the second wiring substrate 210Cb, and a protection layer 230C protecting memory chips 221, and the like, disposed on the second wiring substrate 210Cb.

The fan-out semiconductor package module 300C according to the present exemplary embodiment may have a structure in which the fan-out semiconductor package 100C is introduced, a main semiconductor chip 120C such as ICs is mounted in the fan-out semiconductor package 100C, and a plurality of component packages 200Ca and 200Cb in which the memory chips, and the like, may be mounted is stacked on the fan-out semiconductor package 100C. Therefore, a micro fan-out semiconductor package module that has increased functionality and improved reliability may be provided. In this case, the semiconductor chip 120C of the fan-out semiconductor package 100C may be disposed in a face-up form and be electrically connected to the component package 200C through the second interconnection member 140C and the first connection terminals 160C connected to the second interconnection member 140C, resulting in a very short transfer pathway of signals, or the like. In addition, in the fan-out semiconductor package 100C, the first interconnection member 110C in which redistribution layers 112a, 112b, and 112c, and the like, are formed is introduced in the surrounding of the semiconductor chip 120C, and the second connection terminals 170C electrically connected to the encapsulant 130C is introduced below the encapsulant 130C, such that the fan-out semiconductor package module 300C may be stably mounted on a main board 500 of an electronic device.

The respective components included in the fan-out semiconductor package module according to the present exemplary embodiment will hereinafter be described in more detail, but a description of contents overlapping those described above will be omitted.

Referring to the drawings, at least one connection pad 122 and second connection terminal 170C may be connected to each other by an electrical pathway P-6 traversing the first wiring substrate 210Ca and the first interconnection member 110C. For example, at least one of the connection pads 122 of the semiconductor chip 120C may be electrically connected to at least one of the second connection terminals 170C through the electrical pathway P-6 traversing the second interconnection member 140C, the first connection terminal 160C, the first wiring substrate 210Ca, the first connection terminal 160C, the second interconnection member 140C, and the first interconnection member 110C in the abovementioned sequence or in the opposite sequence. In this case, the electrical pathway P-6 may be connected to a passive component 223 such as a surface mounted capacitor, a surface mounted thin film inductor, or the like, disposed on the first wiring substrate 210Ca using an underfill resin 218, or the like. As described above, the semiconductor chip 120C may be connected to the surface mounted passive component 223 through the electrical pathway P-6 which is relatively short, which is advantageous in securing power integrity (PI) characteristics. Meanwhile, the semiconductor chip 120C is not necessarily electrically connected to the passive component 223 by only the electrical pathway P-6 described above, but may also be electrically connected to the passive component 223 by another pathway. Meanwhile, in a case in which the passive component 223 is mounted on the first wiring substrate 210Ca and is connected to the semiconductor chip 120C as described above, a separate land side capacitor (LSC) does not need to be disposed below the fan-out semiconductor package 100C, and a height of the second connection terminals 170C may thus be lowered. In addition, memory signals of the semiconductor chip 120C disposed in the face-up form may be connected to the memory chips 221 at a short distance through the wiring substrates 210Ca and 210Cb, which may be advantageous in characteristics of memories.

The second interconnection member 140C may include a plurality of insulating layers 141a and 141b. The plurality of insulating layers 141a and 141b may include the same insulating material or different insulating materials. Openings exposing at least portions of patterns serving as connection terminal pads in the redistribution layer 142 may be formed in an upper insulating layer 141b, and an under-bump metal layer 145 may be formed in the openings. The first wiring substrate 210Ca may include a first insulating layer 211A and third insulating layers 211C covering opposite surfaces of the first insulating layer 211A. In addition, the first wiring substrate 210Ca may include redistribution layers 212 and vias 213 formed on and in the first insulating layer 211A. The first insulating layer 211A may be a known core layer formed of prepreg, or the like, and the third insulating layer 211C may be a known PID film formed of solder resist, or the like. However, the first and third insulating layers are not limited thereto. The first wiring substrate 210Ca may include an under-bump metal layer 215a connected to the other first connection terminals 160C. The second wiring substrate 210Cb may include a plurality of insulating layers and redistribution layers and vias formed on and in the plurality of insulating layers. The second wiring substrate 210Cb may include an under-bump metal layer connected to the third connection terminals 180C. The third connection terminals 180C may be solder balls, copper cored balls, copper posts, or the like. The second connection terminals 170C may be disposed in both of a fan-in region and a fan-out region through the third interconnection member 150C. However, the second connection terminals 170C are not limited thereto.

Although not illustrated in the drawings, the fan-out semiconductor package module 300C according to the present exemplary embodiment may be variously modified as in the modified examples of the fan-out semiconductor package module 300A according to the exemplary embodiment described above.

As set forth above, according to the exemplary embodiment in the present disclosure, a micro fan-out semiconductor package module that has increased functionality and improved reliability may be provided.

While exemplary embodiments have been shown and described above, it will be apparent to those skilled in the art that modifications and variations could be made without departing from the scope of the present invention as defined by the appended claims.

What is claimed is:

1. A fan-out semiconductor package module comprising:
   a fan-out semiconductor package including a first interconnection member having a through-hole, a semiconductor chip disposed in the through-hole of the first interconnection member and having an active surface having connection pads disposed thereon and an inactive surface opposing the active surface, an encapsulant encapsulating at least portions of the first interconnection member and the inactive surface of the semiconductor chip, a second interconnection member disposed on the first interconnection member and the active surface of the semiconductor chip, first connection terminals disposed on the second interconnection member, and second connection terminals disposed on the encapsulant, the first interconnection member and the second interconnection member including, respectively, redistribution layers electrically connected to the connection pads of the semiconductor chip; and
   a component package including a wiring substrate disposed above the second interconnection member and connected to the second interconnection member through the first connection terminals and at least one component disposed on the wiring substrate and electrically connected to the wiring substrate,
   wherein the first interconnection member includes a first insulating layer, a first redistribution layer in contact with the second interconnection member and embedded in a first surface of the first insulating layer, and a second redistribution layer disposed on a second surface of the first insulating layer opposing the first surface of the first insulating layer.

2. The fan-out semiconductor package module of claim 1, wherein at least one connection pad and second connection terminal are electrically connected to each other by an electrical pathway traversing the wiring substrate and the first interconnection member.

3. The fan-out semiconductor package module of claim 2, wherein the electrical pathway traverses the connection pad of the semiconductor chip, the second interconnection member, the first connection terminal, the wiring substrate, the first interconnection member, and the second connection terminal.

4. The fan-out semiconductor package module of claim 2, wherein the wiring substrate has a passive component embedded therein, and
   the electrical pathway is connected to the passive component.

5. The fan-out semiconductor package module of claim 2, wherein the wiring substrate includes a first wiring substrate connected to the first connection terminal, a second wiring substrate disposed on the first wiring substrate, and a third connection terminal disposed between the first wiring substrate and the second wiring substrate and connecting the first wiring substrate and the second wiring substrate to each other,
   a passive component mounted on the first wiring substrate is disposed between the first wiring substrate and the second wiring substrate, and
   the electrical pathway is connected to the passive component mounted on the first wiring substrate.

6. The fan-out semiconductor package module of claim 1, wherein the component package includes a memory chip electrically connected to the semiconductor chip.

7. The fan-out semiconductor package module of claim 1, wherein the first connection terminal is surrounded by an underfill resin formed between the second interconnection member and the wiring substrate.

8. The fan-out semiconductor package module of claim 1, wherein the fan-out semiconductor package further includes a third interconnection member disposed on the encapsulant and having the second connection terminals connected thereto,
   wherein the number of first connection terminal pads of the second interconnection member connected to the first connection terminals is greater than the number of second connection terminal pads of the third interconnection member connected to the second connection terminals.

9. The fan-out semiconductor package module of claim 1, wherein the first interconnection member further includes a second insulating layer disposed on the first insulating layer and covering the second redistribution layer and a third redistribution layer disposed on the second insulating layer.

10. The fan-out semiconductor package module of claim 9, wherein the second redistribution layer is disposed on a level between the active surface and the inactive surface of the semiconductor chip.

11. The fan-out semiconductor package module of claim 1, wherein a distance between the redistribution layer of the second interconnection member and the first redistribution layer is greater than that between the redistribution layer of the second interconnection member and the connection pad, the distances being measured between top surfaces of the corresponding layers.

12. The fan-out semiconductor package module of claim 1, wherein the first redistribution layer has a thickness greater than that of the redistribution layer of the second interconnection member.

13. The fan-out semiconductor package module of claim 1, wherein an upper surface of the first redistribution layer is disposed on a level below an upper surface of the connection pad.

14. The fan-out semiconductor package module of claim 1, wherein the first interconnection member includes the first insulating layer, the first redistribution layer and the second redistribution layer disposed on opposite surfaces of the first insulating layer, respectively, a second insulating layer disposed on the first insulating layer and covering the first redistribution layer, and a third redistribution layer disposed on the second insulating layer.

15. The fan-out semiconductor package module of claim 14, wherein the first interconnection member further includes the third insulating layer disposed on the first insulating layer and covering the second redistribution layer and a fourth redistribution layer disposed on the third insulating layer.

16. The fan-out semiconductor package module of claim 14, wherein the first insulating layer has a thickness greater than that of the second insulating layer.

17. The fan-out semiconductor package module of claim 14, wherein the third redistribution layer has a thickness greater than that of the redistribution layer of the second interconnection member.

18. The fan-out semiconductor package module of claim 14, wherein the first redistribution layer is disposed on a level between the active surface and the inactive surface of the semiconductor chip.

19. The fan-out semiconductor package module of claim 14, wherein an upper surface of the third redistribution layer is disposed on a level above an upper surface of the connection pad.

* * * * *